(12) United States Patent
Ahn et al.

(10) Patent No.: US 7,863,667 B2
(45) Date of Patent: Jan. 4, 2011

(54) ZIRCONIUM TITANIUM OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 1199 days.

(21) Appl. No.: 11/212,306

(22) Filed: Aug. 26, 2005

(65) Prior Publication Data

US 2005/0280067 A1 Dec. 22, 2005

Related U.S. Application Data

(62) Division of application No. 10/420,307, filed on Apr. 22, 2003, now Pat. No. 7,183,186.

(51) Int. Cl.
*H01L 27/108* (2006.01)
*H01L 29/94* (2006.01)

(52) U.S. Cl. ............................. 257/310; 257/E29.015; 257/E29.309; 257/E21.423; 257/E21.456

(58) Field of Classification Search ................. 257/310, 257/296, 595, 215, E29.015, E29.309, E21.423, 257/E21.456, E21.129; 438/260, 778
See application file for complete search history.

(56) References Cited

U.S. PATENT DOCUMENTS

| | | | |
|---|---|---|---|
| 4,058,430 A | 11/1977 | Suntola et al. | |
| 5,055,319 A | 10/1991 | Bunshah et al. | |
| 5,192,871 A * | 3/1993 | Ramakrishnan et al. | 257/595 |
| 5,302,461 A | 4/1994 | Anthony | |
| 5,572,052 A | 11/1996 | Kashihara et al. | |
| 5,621,681 A | 4/1997 | Moon | |
| 5,625,233 A | 4/1997 | Cabral, Jr. et al. | |
| 5,674,563 A | 10/1997 | Tarui et al. | |
| 5,744,374 A | 4/1998 | Moon | |
| 5,751,021 A | 5/1998 | Teraguchi | |

(Continued)

FOREIGN PATENT DOCUMENTS

EP 0540993 A1 5/1993

(Continued)

OTHER PUBLICATIONS

Aarik, Jaan, et al., "Atomic layer growth of epitaxial TiO/sub 2/ thin films from TiCl/sub 4/ and H/sub 2/O on alpha -Al/sub 2/O/sub 3/ substrates", *Journal of Crystal Growth*, 242 (1-2), (2002), 189-198.

(Continued)

*Primary Examiner*—Davienne Monbleau
*Assistant Examiner*—Monica D Harrison
(74) *Attorney, Agent, or Firm*—Schwegman, Lundberg & Woessner, P.A.

(57) ABSTRACT

Dielectric layers having an atomic layer deposited oxide containing titanium and zirconium and a method of fabricating such a dielectric layer produce a reliable dielectric layer having an equivalent oxide thickness thinner than attainable using $SiO_2$. Pulsing a titanium-containing precursor onto a substrate, and pulsing a zirconium-containing precursor to form an oxide containing Zr and Ti by atomic layer deposition provides a dielectric layer with a relatively high dielectric constant as compared with silicon oxide. A zirconium-containing precursor to form the oxide containing Zr and Ti can include zirconium tertiary-butoxide.

34 Claims, 6 Drawing Sheets

U.S. PATENT DOCUMENTS

| | | | |
|---|---|---|---|
| 5,795,808 A | 8/1998 | Park | |
| 5,801,105 A | 9/1998 | Yano et al. | |
| 5,810,923 A | 9/1998 | Yano et al. | |
| 5,828,080 A | 10/1998 | Yano et al. | |
| 5,840,897 A | 11/1998 | Kirlin et al. | |
| 5,912,797 A | 6/1999 | Schneemeyer et al. | |
| 5,916,365 A | 6/1999 | Sherman | |
| 5,998,264 A * | 12/1999 | Wu | 438/260 |
| 6,010,969 A | 1/2000 | Vaartstra | |
| 6,020,024 A | 2/2000 | Maiti et al. | |
| 6,027,961 A | 2/2000 | Maiti et al. | |
| 6,060,755 A | 5/2000 | Ma et al. | |
| 6,093,944 A | 7/2000 | VanDover | |
| 6,110,529 A | 8/2000 | Gardiner et al. | |
| 6,171,900 B1 | 1/2001 | Sun | |
| 6,174,809 B1 | 1/2001 | Kang et al. | |
| 6,200,893 B1 | 3/2001 | Sneh | |
| 6,203,613 B1 | 3/2001 | Gates et al. | |
| 6,210,999 B1 | 4/2001 | Gardner et al. | |
| 6,211,035 B1 | 4/2001 | Moise et al. | |
| 6,225,168 B1 | 5/2001 | Gardner et al. | |
| 6,225,237 B1 | 5/2001 | Vaartstra | |
| 6,273,951 B1 | 8/2001 | Vaartstra | |
| 6,291,866 B1 | 9/2001 | Wallace et al. | |
| 6,294,420 B1 | 9/2001 | Tsu et al. | |
| 6,297,539 B1 | 10/2001 | Ma et al. | |
| 6,300,203 B1 | 10/2001 | Buynoski et al. | |
| 6,300,255 B1 | 10/2001 | Venkataranan et al. | |
| 6,313,035 B1 | 11/2001 | Sandhu et al. | |
| 6,331,465 B1 | 12/2001 | Forbes et al. | |
| 6,368,398 B2 | 4/2002 | Vaartstra | |
| 6,368,941 B1 | 4/2002 | Chen et al. | |
| 6,380,579 B1 | 4/2002 | Nam et al. | |
| 6,392,257 B1 | 5/2002 | Ramdani et al. | |
| 6,395,650 B1 | 5/2002 | Callegari et al. | |
| 6,407,435 B1 | 6/2002 | Ma et al. | |
| 6,417,537 B1 * | 7/2002 | Yang et al. | 257/310 |
| 6,420,279 B1 | 7/2002 | Ono et al. | |
| 6,432,779 B1 | 8/2002 | Hobbs et al. | |
| 6,444,592 B1 | 9/2002 | Ballantine et al. | |
| 6,451,641 B1 | 9/2002 | Halliyal et al. | |
| 6,451,695 B2 | 9/2002 | Sneh | |
| 6,458,701 B1 | 10/2002 | Chae et al. | |
| 6,461,914 B1 | 10/2002 | Roberts et al. | |
| 6,461,970 B1 | 10/2002 | Yin | |
| 6,465,334 B1 | 10/2002 | Buynoski et al. | |
| 6,465,853 B1 | 10/2002 | Hobbs et al. | |
| 6,482,740 B2 | 11/2002 | Soininen et al. | |
| 6,495,436 B2 | 12/2002 | Ahn et al. | |
| 6,500,499 B1 | 12/2002 | Senzaki et al. | |
| 6,509,280 B2 | 1/2003 | Choi | |
| 6,514,828 B2 | 2/2003 | Ahn et al. | |
| 6,521,911 B2 | 2/2003 | Parsons et al. | |
| 6,527,866 B1 | 3/2003 | Matijasevic et al. | |
| 6,528,858 B1 | 3/2003 | Yu et al. | |
| 6,534,357 B1 | 3/2003 | Basceri | |
| 6,534,420 B2 | 3/2003 | Ahn et al. | |
| 6,537,613 B1 | 3/2003 | Senzaki et al. | |
| 6,541,079 B1 | 4/2003 | Bojarczuk, Jr. et al. | |
| 6,544,875 B1 | 4/2003 | Wilk | |
| 6,551,929 B1 | 4/2003 | Kori et al. | |
| 6,559,014 B1 | 5/2003 | Jeon | |
| 6,562,491 B1 | 5/2003 | Jeon | |
| 6,566,147 B2 | 5/2003 | Basceri et al. | |
| 6,586,349 B1 | 7/2003 | Jeon et al. | |
| 6,586,792 B2 | 7/2003 | Ahn et al. | |
| 6,590,252 B2 | 7/2003 | Kutsunai et al. | |
| 6,592,942 B1 | 7/2003 | Van Wijck | |
| 6,596,583 B2 | 7/2003 | Agarwal et al. | |
| 6,602,338 B2 | 8/2003 | Chen et al. | |
| 6,608,378 B2 | 8/2003 | Ahn et al. | |
| 6,613,695 B2 | 9/2003 | Pomarede et al. | |
| 6,627,503 B2 | 9/2003 | Ma et al. | |
| 6,632,279 B1 | 10/2003 | Ritala et al. | |
| 6,638,859 B2 | 10/2003 | Sneh et al. | |
| 6,639,267 B2 | 10/2003 | Eldridge | |
| 6,642,567 B1 | 11/2003 | Marsh | |
| 6,642,573 B1 | 11/2003 | Halliyal et al. | |
| 6,645,882 B1 | 11/2003 | Halliyal et al. | |
| 6,652,924 B2 | 11/2003 | Sherman | |
| 6,660,578 B1 | 12/2003 | Karlsson et al. | |
| 6,660,660 B2 | 12/2003 | Haukka et al. | |
| 6,661,058 B2 | 12/2003 | Ahn et al. | |
| 6,673,701 B1 | 1/2004 | Marsh et al. | |
| 6,674,138 B1 | 1/2004 | Halliyal et al. | |
| 6,686,212 B1 | 2/2004 | Conley, Jr. et al. | |
| 6,696,332 B2 | 2/2004 | Visokay et al. | |
| 6,699,747 B2 | 3/2004 | Ruff et al. | |
| 6,709,989 B2 | 3/2004 | Ramdani et al. | |
| 6,713,846 B1 | 3/2004 | Senzaki | |
| 6,730,575 B2 | 5/2004 | Eldridge | |
| 6,750,066 B1 | 6/2004 | Cheung et al. | |
| 6,750,126 B1 | 6/2004 | Visokay et al. | |
| 6,754,108 B2 | 6/2004 | Forbes | |
| 6,759,151 B1 | 7/2004 | Lee | |
| 6,762,114 B1 | 7/2004 | Chambers | |
| 6,767,582 B1 | 7/2004 | Elers | |
| 6,767,795 B2 | 7/2004 | Ahn et al. | |
| 6,768,175 B1 | 7/2004 | Morishita et al. | |
| 6,770,536 B2 | 8/2004 | Wilk et al. | |
| 6,777,353 B2 | 8/2004 | Putkonen | |
| 6,778,441 B2 | 8/2004 | Forbes et al. | |
| 6,780,704 B1 | 8/2004 | Raaijmakers et al. | |
| 6,787,370 B2 | 9/2004 | Forbes | |
| 6,787,413 B2 | 9/2004 | Ahn | |
| 6,790,791 B2 | 9/2004 | Ahn et al. | |
| 6,794,315 B1 | 9/2004 | Klemperer et al. | |
| 6,800,567 B2 | 10/2004 | Cho | |
| 6,804,136 B2 | 10/2004 | Forbes | |
| 6,812,100 B2 | 11/2004 | Ahn et al. | |
| 6,821,862 B2 | 11/2004 | Cho | |
| 6,821,873 B2 | 11/2004 | Visokay et al. | |
| 6,831,315 B2 | 12/2004 | Raaijmakers et al. | |
| 6,844,203 B2 | 1/2005 | Ahn et al. | |
| 6,844,260 B2 | 1/2005 | Sarigiannis et al. | |
| 6,844,604 B2 | 1/2005 | Lee et al. | |
| 6,852,167 B2 | 2/2005 | Ahn | |
| 6,858,444 B2 | 2/2005 | Ahn et al. | |
| 6,864,191 B2 * | 3/2005 | Yoon | 438/778 |
| 6,884,739 B2 | 4/2005 | Ahn et al. | |
| 6,888,739 B2 | 5/2005 | Forbes | |
| 6,893,984 B2 | 5/2005 | Ahn et al. | |
| 6,900,122 B2 | 5/2005 | Ahn et al. | |
| 6,900,481 B2 | 5/2005 | Jin et al. | |
| 6,914,800 B2 | 7/2005 | Ahn et al. | |
| 6,921,702 B2 | 7/2005 | Ahn et al. | |
| 6,930,059 B2 | 8/2005 | Conley, Jr. et al. | |
| 6,930,346 B2 | 8/2005 | Ahn et al. | |
| 6,933,225 B2 | 8/2005 | Werkhoven et al. | |
| 6,958,302 B2 | 10/2005 | Ahn et al. | |
| 6,958,937 B2 | 10/2005 | Forbes et al. | |
| 6,979,855 B2 | 12/2005 | Ahn et al. | |
| 7,012,297 B2 | 3/2006 | Bhattacharyya | |
| 7,112,841 B2 | 9/2006 | Eldridge et al. | |
| 7,135,734 B2 | 11/2006 | Eldridge et al. | |
| 7,141,278 B2 | 11/2006 | Koh et al. | |
| 7,250,338 B2 | 7/2007 | Bhattacharyya | |
| 2001/0002280 A1 | 5/2001 | Sneh | |
| 2001/0009695 A1 | 7/2001 | Saanila et al. | |
| 2001/0012698 A1 | 8/2001 | Hayashi et al. | |
| 2001/0030352 A1 | 10/2001 | Ruf et al. | |
| 2002/0001971 A1 | 1/2002 | Cho | |
| 2002/0024080 A1 | 2/2002 | Derderian et al. | |
| 2002/0068466 A1 | 6/2002 | Lee et al. | |

| | | |
|---|---|---|
| 2002/0086507 A1 | 7/2002 | Park et al. |
| 2002/0086555 A1 | 7/2002 | Ahn et al. |
| 2002/0089023 A1 | 7/2002 | Yu et al. |
| 2002/0094632 A1 | 7/2002 | Agarwal et al. |
| 2002/0111001 A1 | 8/2002 | Ahn et al. |
| 2002/0122885 A1 | 9/2002 | Ahn |
| 2002/0142536 A1 | 10/2002 | Zhang et al. |
| 2002/0146916 A1 | 10/2002 | Irino et al. |
| 2002/0155688 A1 | 10/2002 | Ahn et al. |
| 2002/0155689 A1 | 10/2002 | Ahn et al. |
| 2002/0164420 A1 | 11/2002 | Derderian et al. |
| 2002/0190294 A1* | 12/2002 | Iizuka et al. ............ 257/296 |
| 2002/0192974 A1 | 12/2002 | Ahn et al. |
| 2002/0192975 A1 | 12/2002 | Ahn et al. |
| 2002/0192979 A1 | 12/2002 | Ahn |
| 2002/0197856 A1 | 12/2002 | Matsuse et al. |
| 2003/0001212 A1 | 1/2003 | Hu et al. |
| 2003/0003635 A1 | 1/2003 | Paranjpe et al. |
| 2003/0003702 A1 | 1/2003 | Ahn |
| 2003/0003722 A1 | 1/2003 | Vaartstra |
| 2003/0017717 A1 | 1/2003 | Ahn |
| 2003/0032270 A1 | 2/2003 | Snyder et al. |
| 2003/0043637 A1 | 3/2003 | Forbes et al. |
| 2003/0045060 A1 | 3/2003 | Ahn |
| 2003/0045078 A1 | 3/2003 | Ahn et al. |
| 2003/0048666 A1 | 3/2003 | Eldridge et al. |
| 2003/0049942 A1 | 3/2003 | Haukka et al. |
| 2003/0059535 A1 | 3/2003 | Luo et al. |
| 2003/0104666 A1 | 6/2003 | Bojarczuk, Jr. et al. |
| 2003/0119246 A1 | 6/2003 | Ahn et al. |
| 2003/0119291 A1 | 6/2003 | Ahn et al. |
| 2003/0119313 A1 | 6/2003 | Yang et al. |
| 2003/0124794 A1 | 7/2003 | Girardie |
| 2003/0132491 A1 | 7/2003 | Ahn et al. |
| 2003/0141560 A1 | 7/2003 | Sun |
| 2003/0157764 A1 | 8/2003 | Ahn et al. |
| 2003/0175411 A1 | 9/2003 | Kodas et al. |
| 2003/0176049 A1 | 9/2003 | Hegde et al. |
| 2003/0185980 A1 | 10/2003 | Endo |
| 2003/0193061 A1 | 10/2003 | Osten |
| 2003/0207032 A1 | 11/2003 | Ahn et al. |
| 2003/0207540 A1 | 11/2003 | Ahn et al. |
| 2003/0207593 A1 | 11/2003 | Derderian et al. |
| 2003/0213987 A1 | 11/2003 | Basceri |
| 2003/0216038 A1 | 11/2003 | Madhukar et al. |
| 2003/0222300 A1 | 12/2003 | Basceri et al. |
| 2003/0224600 A1 | 12/2003 | Cao et al. |
| 2003/0227033 A1 | 12/2003 | Ahn et al. |
| 2003/0228747 A1 | 12/2003 | Ahn et al. |
| 2003/0232511 A1 | 12/2003 | Metzner et al. |
| 2003/0235064 A1 | 12/2003 | Batra et al. |
| 2003/0235961 A1 | 12/2003 | Metzner et al. |
| 2004/0004244 A1 | 1/2004 | Ahn et al. |
| 2004/0004245 A1 | 1/2004 | Forbes et al. |
| 2004/0004247 A1 | 1/2004 | Forbes et al. |
| 2004/0004859 A1 | 1/2004 | Forbes et al. |
| 2004/0007171 A1 | 1/2004 | Ritala et al. |
| 2004/0009679 A1 | 1/2004 | Yeo et al. |
| 2004/0023461 A1 | 2/2004 | Ahn et al. |
| 2004/0033681 A1 | 2/2004 | Ahn et al. |
| 2004/0033701 A1 | 2/2004 | Ahn et al. |
| 2004/0038525 A1 | 2/2004 | Meng et al. |
| 2004/0038554 A1 | 2/2004 | Ahn |
| 2004/0040494 A1 | 3/2004 | Vaartstra et al. |
| 2004/0043541 A1 | 3/2004 | Ahn |
| 2004/0043569 A1 | 3/2004 | Ahn |
| 2004/0043635 A1 | 3/2004 | Vaartstra |
| 2004/0092073 A1 | 5/2004 | Cabral, Jr. et al. |
| 2004/0094801 A1 | 5/2004 | Liang et al. |
| 2004/0099889 A1 | 5/2004 | Frank et al. |
| 2004/0104439 A1 | 6/2004 | Haukka et al. |
| 2004/0110348 A1 | 6/2004 | Ahn et al. |
| 2004/0110391 A1 | 6/2004 | Ahn et al. |
| 2004/0135186 A1 | 7/2004 | Yamamoto |
| 2004/0144980 A1 | 7/2004 | Ahn et al. |
| 2004/0159863 A1 | 8/2004 | Eldridge et al. |
| 2004/0164357 A1 | 8/2004 | Ahn et al. |
| 2004/0164365 A1 | 8/2004 | Ahn et al. |
| 2004/0168627 A1 | 9/2004 | Conley, Jr. et al. |
| 2004/0171280 A1 | 9/2004 | Conley, Jr. et al. |
| 2004/0175882 A1 | 9/2004 | Ahn et al. |
| 2004/0183108 A1 | 9/2004 | Ahn |
| 2004/0185654 A1 | 9/2004 | Ahn |
| 2004/0203254 A1 | 10/2004 | Conley, Jr. et al. |
| 2004/0214399 A1 | 10/2004 | Ahn et al. |
| 2004/0222476 A1 | 11/2004 | Ahn et al. |
| 2004/0233010 A1 | 11/2004 | Akram et al. |
| 2004/0235313 A1 | 11/2004 | Frank et al. |
| 2004/0262700 A1 | 12/2004 | Ahn et al. |
| 2005/0009370 A1 | 1/2005 | Ahn |
| 2005/0020017 A1 | 1/2005 | Ahn et al. |
| 2005/0023574 A1 | 2/2005 | Forbes et al. |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026349 A1 | 2/2005 | Forbes et al. |
| 2005/0026374 A1 | 2/2005 | Ahn et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0034662 A1 | 2/2005 | Ahn |
| 2005/0037563 A1 | 2/2005 | Ahn |
| 2005/0054165 A1 | 3/2005 | Ahn et al. |
| 2005/0077519 A1 | 4/2005 | Ahn et al. |
| 2005/0112874 A1 | 5/2005 | Skarp et al. |
| 2005/0124174 A1 | 6/2005 | Ahn et al. |
| 2005/0138262 A1 | 6/2005 | Forbes |
| 2005/0140462 A1 | 6/2005 | Akram et al. |
| 2005/0145957 A1 | 7/2005 | Ahn et al. |
| 2005/0158973 A1 | 7/2005 | Ahn et al. |
| 2005/0164521 A1 | 7/2005 | Ahn et al. |
| 2005/0212119 A1 | 9/2005 | Shero et al. |
| 2005/0227442 A1 | 10/2005 | Ahn et al. |
| 2005/0277256 A1 | 12/2005 | Ahn et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0043492 A1 | 3/2006 | Ahn et al. |
| 2006/0170032 A1 | 8/2006 | Bhattacharyya |
| 2007/0047319 A1 | 3/2007 | Bhattacharyya |

FOREIGN PATENT DOCUMENTS

| | | |
|---|---|---|
| EP | 1096042 | 5/2001 |
| EP | 1124262 | 8/2001 |
| JP | 01044420 | 2/2001 |
| WO | WO-02/31875 | 4/2002 |
| WO | WO-02/43115 | 5/2002 |

OTHER PUBLICATIONS

Cava, R J., "Improvement of the dielectric properties of Ta/sub 2/O/sub 5/ through substitution with Al/sub 2/O/sub 3/", *Applied Physics Letters*, 70(11), (Mar. 1997), 1396-8.

Chang, Hyo S., et al., "Excellent thermal stability of Al2O3/ZrO2/Al2O3 stack structure of metal-oxide-semiconductor gate dielectrics application", *Applied Physics Letters*, 80(18), (May 6, 2002), 3385-7.

Chen, P. J., et al., "Thermal stability and scalability of Zr-aluminate-based high-k gate stacks", *Symposium on VLSI Technology Digest*, (2002),192-3.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999), 1537-1544.

Clark-Phelps, R. B., et al., "Engineered Tantalum Aluminate and Hafnium Aluminate ALD Films for Ultrathin Dielectric Films with Improved Electric and Thermal Properties", *Gate Stack and Silicide Issues in Silicon Processing II. Symposium (Materials Research Society Symposium Proceedings* vol. 670), (Apr. 17, 2001),K2.2.1-6.

Colombo, D., et al., "Anhydrous Metal Nitrates as Volatile Single Source Precursors for the CVD of Metal Oxide Films", *Communications, Department of EE, U of M, Mpls MN*, (Jul. 7, 1998),3 pages.

Copel, M., et al., "Structure and stability of ultrathin zirconium oxide layers on Si(001)", *Applied Physics Letters*, 76(4), (Jan. 2000),436-438.

Da Rosa, E B., et al., "Annealing of ZrAl/sub x/O/sub y/ ultrathin films on Si in a vacuum or in O/sub 2/", *Journal of the Electrochemical Society*, 148 (12), (Dec. 2001),G695-G703.

De Flaviis, Franco, et al., "Planar microwave integrated phase-shifter design with high purity ferroelectric material", *IEEE Transactions on Microwave Theory & Techniques*, 45(6), (Jun. 1997),963-969.

Fuyuki, Takashi, et al., "Electronic Properties of the Interface between Si and TiO2 Deposited at Very Low Temperatures", *Japanese Journal of Applied Physics*, 25(9), (1986),1288-1291.

Gartner, M, "Spectroellipsometric characterization of lanthanide-doped TiO2 films obtained via the sol-gel technique", *Thin Solid Films*, 234(1-2), (1993),561-565.

Guo, Xin, et al., "High quality ultra-thin (1.5 nm) TiO2-Si3N 4 gate dielectric for deep sub-micron CMOS technology", *IEDM Technical Digest. International Electron Devices Meeting*, (Dec. 5-8, 1999),137-140.

Gusev, E P., "Ultrathin High-K Dielectrics Grown by Atomic Layer Deposition: A Comparative Study of ZrO2, HfO2, Y2O3 and Al2O3", *Electrochemical Society Proceedings* vol. 2001-9, (2001),189-195.

Gutowski, M J., "Thermodynamic stability of high-K dielectric metal oxides ZrO/sub 2/ and HfO/sub 2/ in contact with Si and SiO/sub 2/", *Applied Physics Letters*, 80(11), (Mar. 18, 2002), 1897-1899.

Hubbard, K. J., et al., "Thermodynamic stability of binary oxides in contact with silicon", *Journal of Materials Research*, 11(11), (Nov. 1996),2757-2776.

Iddles, D M., et al., "Relationships between dopants, microstructure and the microwave dielectric properties of ZrO2-TiO2-SnO2 ceramics", *Journal of Materials Science*, 27(23), (Dec. 1992),6303-6310.

Keomany, D, et al., "Sol gel preparation of mixed cerium-titanium oxide thin films", *Solar Energy Materials and Solar Cells*, 33(4), (Aug. 1994),429-441.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1-7.8.6.

Kim, Taeseok, et al., "Correlation between strain and dielectric properties in ZrTiO/sub 4/ thin films", *Applied Physics Letters*, 76(21), (May 2000),3043-3045.

Kim, Taeseok, et al., "Dielectric properties and strain analysis in paraelectric ZrTiO/sub 4/ thin films deposited by DC magnetron sputtering", *Japanese Journal of Applied Physics Part 1-Regular Papers Short Notes & Review Papers*, 39(7A), (2000),4153-4157.

Kim, Yongjo, et al., "Effect of microstructures on the microwave dielectric properties of ZrTiO/sub 4/ thin films", *Applied Physics Letters*, 78(16), (Apr. 16, 2001),2363-2365.

Kukli, Kaupo, "Atomic Layer Deposition of Titanium Oxide from TiI4 and H2O2", *Chemical Vapor Deposition*, 6(6), (2000),303-310.

Kukli, Kaupo, "Dielectric Properties of Zirconium Oxide Grown by Atomic Layer Deposition from Iodide Precursor", *Journal of the Electrochemical Society*, 148(12), (2001),F227-F232.

Kukli, Kaupo, et al., "Influence of thickness and growth temperature on the properties of zirconium oxide films growth by atomic layer deposition on silicon", *Thin Solid Films*, 410(1-2), (2002),53-60.

Kukli, Kaupo, et al., "Low-Temperature Deposition of Zirconium Oxide-Based Nanocrystalline Films by Alternate Supply of Zr[OC(CH3)3]4 and H2O", *Chemical Vapor Deposition*, 6(6), (2000),297-302.

Lee, Dong H., et al., "Metalorganic chemical vapor deposition of TiO2:N anatase thin film on Si substrate", *Appl. Phys. Lett.*, 66(7), (Feb. 1995),815-816.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest. International*, (2000),27-30.

Lee, C H., et al., "MOS Devices with High Quality Ultra Thin CVD ZrO2 Gate Dielectrics and Self-Aligned TaN and TaN/Poly-Si Gate electrodes", *2001 Symposium on VLSI, Technology Digest of Technical Papers*, (2001),137-138.

Leskela, M., et al., "ALD precursor chemistry: Evolution and future challenges", *J. Phys. IV France*, 9, (1999),837-852.

Liu, C. T., "Circuit Requirement and Integration Challenges of Thin Gate Dielectrics for Ultra Small MOSFETs", *International Electron Devices Meeting 1998. Technical Digest*, (1998),747-750.

Luo, Z J., et al., "Ultra-thin ZrO2 (or Silicate) with High Thermal Stability for CMOS Gate Applications", *2001 Symposium on VLSI Technology Digest of Technical Papers*, (2001),135-136.

Martin, P J., et al., "Ion-beam-assisted deposition of thin films", *Applied Optics*, 22(1), (Jan. 1983),178-184.

Nakagawara, Osamu, et al., "Electrical properties of (Zr, Sn)TiO4 dielectric thin film prepared by pulsed laser deposition", *Journal of Applied Physics*, 80(1), (Jul. 1996),388-392.

Nakajima, Anri, "Atomic-layer deposition of ZrO/sub 2/ with a Si nitride barrier layer", *Applied Physics Letters*, 81(15), (Oct. 2002),2824-2826.

Nakajima, Anri, "NH/sub 3/-annealed atomic-layer-deposited silicon nitride as a high-k gate dielectric with high reliability", *Applied Physics Letters*, 80(7), (Feb. 2002), 1252-1254.

Nakajima, Anri, "Soft breakdown free atomic-layer-deposited silicon-nitride/SiO/sub 2/ stack gate dielectrics", *International Electron Devices Meeting. Technical Digest*, (2001),6.5.1-4.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001),1801-1808.

Niilisk, A, "Atomic-scale optical monitoring of the initial growth of TiO2 thin films", *Proceedings of the SPIE—The International Society for Optical Engineering*, 4318, (2001),72-77.

Oates, D E., et al., "Surface impedance measurements of YBa/sub 2/Cu/sub 3/O/sub 7-x/ thin films in stripline resonators", *IEEE Transactions on Magnetics*, vol. 27, No. 2, pt.2, (Mar. 1991),867-871.

Perkins, Charles M., et al., "Electrical and materials properties of ZrO2 gate dielectrics grown by atomic layer chemical vapor deposition", *Applied Physics Letters*, 78(16), Apr. 2001),2357-2359.

Poveshchenko, V P., et al., "Investigation of the phase composition of films of zirconium, hafnium and yttrium oxides", *Soviet Journal of Optical Technology*, 51(5), (1984),277-279.

Qi, Wen-Jie, et al., "MOSCAP and MOSFET characteristics using ZrO2 gate dielectric deposited directly on Si", *Electron Devices Meeting, 1999. IEDM Technical Digest. International*, (1999),145-148.

Qi, Wen-Jie, et al., "Performance of MOSFETs with ultra thin ZrO/sub 2/ and Zr silicate gate dielectrics", *2000 Symposium on VLSI Technology. Digest of Technical Papers*, (2000),40-41.

Rahtu, Antti, "Atomic Layer Deposition of Zirconium Titanium Oxide from Titanium Isopropoxide and Zirconium Chloride", *Chemistry of Materials*, 13(5), (May 2001),1528-1532.

Ramakrishnan, E S., et al., "Dielectric properties of radio frequency magnetron sputter deposited zirconium titanate-based thin films", *Journal of the Electrochemical Society*, 145(1), (Jan. 1998),358-362.

Rayner Jr., G, et al., "The structure of plasma-deposited and annealed pseudo-binary ZrO2-SiO2 alloys", *Materials Research Society Symposium—Proceedings*, 611, (2000),C131-C139.

Ritala, Mikko, "Atomic Layer Epitaxy Growth of Titanium, Zirconium and Hafnium Dioxide Thin Films", *Annales Academiae Scientiarum Fennicae*, (1994),24-25.

Ritala, Mikko, "Zirconium dioxide thin films deposited by ALE using zirconium tetrachloride as precursor", *Applied Surface Science*, 75, (Jan. 1994),333-340.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000),105-114.

Sneh, Ofer, "Thin film atomic layer deposition equipment for semiconductor processing", *Thin Solid Films*, 402(1-2), (Jan. 2002),248-261.

Suntola, T, "Atomic layer epitaxy", *Thin Solid Films*, 216(1), (Aug. 28, 1992),84-89.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Tarre, A, et al., "Comparative study of low-temperature chloride atomic-layer chemical vapor deposition of TiO2 and SnO2", *Applied Surface Science*, 175-176, (May 2001),111-116.

Van Dover, R B., "Amorphous lanthanide-doped TiOx dielectric films", *Applied Physics Letters*, 74(20), (May 1999),3041-3043.

Van Dover, R B., et al., "Deposition of Uniform Zr-Sn-Ti-O Films by On-Axis Reactive Sputtering", *IEEE Electron Device Letters*, 19(9), (Sep. 1998),329-331.

Van Dover, R. B., "Discovery of a useful thin-film dielectric using a composition-spread approach", *Nature*, 392, (Mar. 12, 1998),162-164.

Wilk, G. D., et al., "High-K gate dielectrics: Current status and materials properties considerations", *Journal of Applied Physics*, 89(10), (May 2001),5243-5275.

Zhang, H., "Atomic Layer Deposition of High Dielectric Constant Nanolaminates", *Journal of the Electrochemical Society*, 148(4), (Apr. 2001),F63-F66.

Zhang, H, "High permittivity thin film nanolaminates", *Journal of Applied Physics*, 87(4), (Feb. 2000),1921-1924.

Ahn, Kie Y., "ALD of Amorphous Lanthanide Doped TiOx Films", U.S. Appl. No. 11/092,072, filed Mar. 29, 2005.

Ahn, Kie Y., "Atomic Layer Deposited Hafnium Tantalum Oxide Dielectrics", U.S. Appl. No. 11/029,757, filed Jan. 5, 2005.

Ahn, Kie Y., "Atomic Layer Deposited Lanthanum Aluminum Oxide Dielectric Layer", U.S. Appl. No. 10/930,167, filed Aug. 31, 2004.

Ahn, Kie Y., "Atomic Layer Deposited Lanthanum Hafnium Oxide Dielectrics", U.S. Appl. No. 11/010,529, filed Dec. 13, 2004.

Ahn, Kie Y., "Atomic Layer Deposited Titanium Aluminum Oxide Films", U.S. Appl. No. 10/931,533, filed Aug. 31, 2004.

Ahn, Kie Y., "Atomic Layer Deposited Titanium Silicon Oxide Films", U.S. Appl. No. 11/093,104, filed Mar. 29, 2005.

Ahn, Kie Y., "Atomic Layer Deposited Zirconium Silicon Oxide Films", U.S. Appl. No. 11/117,121, filed Apr. 28, 2005.

Ahn, Kie Y., "Atomic Layer Deposition of a Ruthenium Layer to a Lanthanide Oxide Dielectric Layer", U.S. Appl. No. 11/117,125, filed Apr. 28, 2005.

Ahn, Kie Y., "Atomic Layer Deposition of $CeO_2/Al_2O_3$ Films as Gate Dielectrics", U.S. Appl. No. 11/055,380, filed Feb. 10, 2005.

Ahn, Kie Y., "Atomic Layer Deposition of Dy-Doped $HfO_2$ FILMS as Gate Dielectrics", U.S. Appl. No. 11/053,577, filed Feb. 8, 2005.

Ahn, Kie Y., "Atomic Layer Deposition of $Hf_3N_4/HfO_2$ Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., "Atomic Layer Deposition of $Zr_3N_4/ZrO_2$ Films as Gate Dielectrics", U.S. Appl. No. 11/058,563, filed Feb. 15, 2005.

Ahn, Kie Y., "Cobalt Titanium Oxide Dielectric Films", U.S. Appl. No. 11/216,958, filed Aug. 31, 2005.

Ahn, Kie Y., "Gallium Lanthanide Oxide Films", U.S. Appl. No. 11/329,025, filed Jan. 10, 2006.

Ahn, Kie Y., "Hafnium Titanium Oxide Films", U.S. Appl. No. 11/140,643, filed May 27, 2005.

Ahn, Kie Y., "Hybrid ALD-CVD of $Pr_xO_y/ZrO_2$ Films as Gate Dielectrics", U.S. Appl. No. 11/010,766, filed Dec. 13, 2004.

Ahn, Kie Y., "Lanthanum Aluminum Oxynitride Dielectric Films", U.S. Appl. No. 11/216,474, filed Aug. 31, 2005.

Ahn, Kie Y., "Ruthenium Gate for a Lanthanide Oxide Dielectric Layer", U.S. Appl. No. 10/926,812, filed Aug. 26, 2004.

Ahn, Kie Y., "Zirconium-Doped Gadolinium Oxide Films", U.S. Appl. No. 11/215,578, filed Aug. 29, 2005.

Domagala, R. F., et al., "The Pseudobinary Ti-$ZrO_2$", J. Am. Ceramic Soc., vol. 56, Paper first presented in 1970,(1973),584-587.

Fuyuki, Takashi, et al., "Electronic Properties of the Interface between Si and $TiO_2$ Deposited at Very Low Temperatures", Japanese Journal of Applied Physics, 25(9), (Sep. 1986),1288-1291.

Kraus, Brenda, "Conductive Nanoparticles", U.S. Appl. No. 11/197,184, filed Aug. 4, 2005.

Nakajima, et al., "Atomic-layer-deposited silicon-nitride/ $SiO_2$ stacked gate dielectrics for highly reliable p-metal-oxide-semiconductor filed-effect transistors", Applied Physics Letters, vol. 77, (Oct. 2000),2855-2857.

Ritala, M., "Atomic layer deposition of oxide thin films with metal alkoxides as oxygen sources", Science, 288(5464), (Apr. 14, 2000),319-321.

* cited by examiner

ZIRCONIUM TITANIUM OXIDE FILMS

CROSS REFERENCE TO RELATED APPLICATIONS

The present application is a divisional of U.S. application Ser. No. 10/420,307, filed on Apr. 22, 2003, now U.S. Pat. No. 7,183,186, which is herein incorporated by reference in its entirety.

This application is related to the following commonly assigned U.S. patent applications, which are herein incorporated by reference in their entirety:

U.S. application Ser. No. 10/137,058, entitled: "Atomic Layer Deposition and Conversion," filed 2 May 2002;

U.S. application Ser. No. 10/137,168, now entitled: "Methods for Atomic- Layer Deposition of Aluminum Oxides in Integrated Circuits," filed 2 May 2002, now U.S. Pat. No. 7,160,577; and U.S. application Ser. No. 09/797,324, entitled: "Methods, Systems, and Apparatus for Uniform Chemical-Vapor Depositions," filed 1 Mar. 2001, now issued as U.S. Pat. No. 6,852,167.

TECHNICAL FIELD

This application relates generally to semiconductor devices and device fabrication and, more particularly, to dielectric layers and their method of fabrication.

BACKGROUND

Dielectric thin films have applications in semiconductor memory devices, such as dynamic random access memory, DRAM, devices and in wireless communication systems. Important characteristics for these applications include low dielectric losses (tan δ) and high dielectric constants (κ). The operating frequencies for devices using these dielectric thin films extend not only to hundreds of megahertz, MHz, but to tens of gigahertz, GHz. As a result, dielectric materials useful for increased scaling in microelectronic devices such as semiconductor memories need to provide low loss characteristics at GHz operating frequencies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a transistor according to the present invention. A transistor 100 is fabricated in a substrate 110 that is typically silicon, but could be fabricated from other semiconductor materials as well. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Although gate dielectric 140 may be formed from materials other than oxides, gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one design criteria is gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. However, increased scaling and other requirements in microelectronic devices have created the need to use other dielectric materials as gate dielectrics.

DETAILED DESCRIPTION

Figure 1:
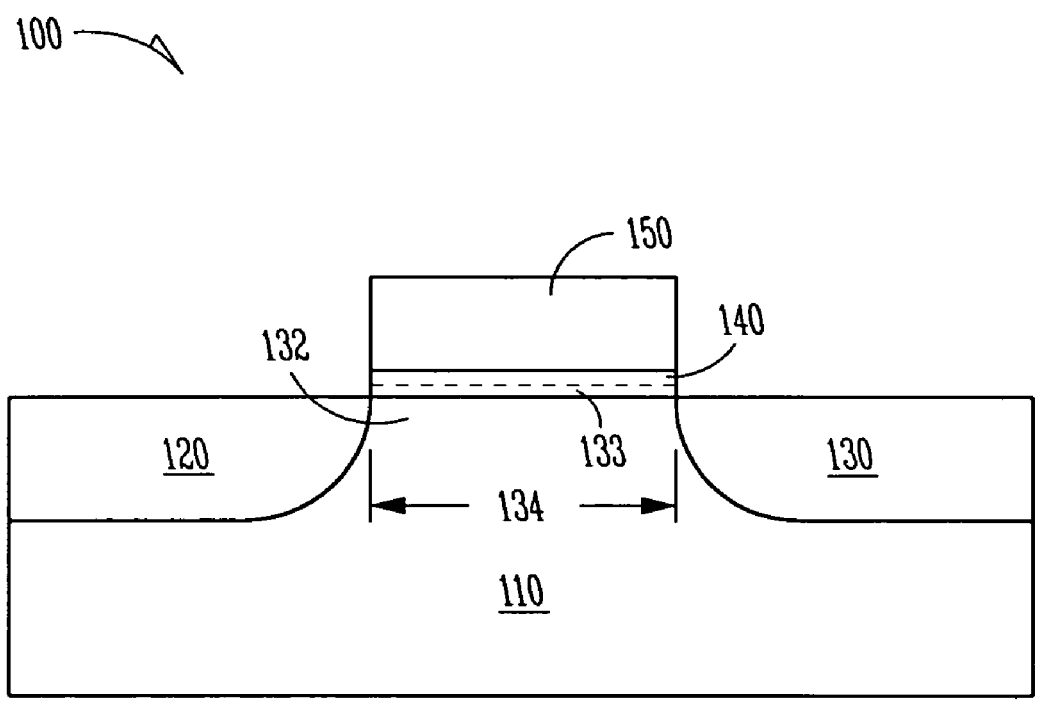
FIG. 1 shows a configuration of a transistor having a gate dielectric containing an oxide of zirconium and titanium formed by atomic layer deposition, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC). The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

An embodiment for a method for forming an oxide film containing titanium and zirconium by atomic layer deposition includes pulsing a titanium-containing precursor onto a substrate, and pulsing a zirconium-containing precursor. Dielectric layers containing an oxide including titanium and zirconium have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. Embodiments include structures for capacitors, transistors, memory devices, and electronic systems with dielectric layers containing an atomic layer deposited oxide of zirconium and titanium, and methods for forming such structures.

In various embodiments, a dielectric layer having an oxide layer containing Zr and Ti is formed by atomic layer deposition. An oxide layer containing Zr and Ti described herein is a zirconium titanium oxide, which includes $ZrTiO_4$, a mixture of $ZrO_2$ and $TiO_2$, and nanolaminates of $ZrO_2$ and $TiO_2$. In an embodiment, a dielectric layer formed by atomic layer deposition includes $ZrTiO_4$ with a predetermined Zr/Ti ratio. Such a dielectric layer includes and can be written as $Zr_xTi_yO_z$, where the ratio x/y is predetermined. By selecting an appropriate ratio x/y, the dielectric layer can be formed as a layer including a variable amount of zirconium and titanium including a zirconium-rich layer, a titanium-rich layer, or a layer having zirconium and titanium in comparable amounts. Selecting the x/y ratio can depend on the application for the dielectric layer. For instances, a titanium-rich dielectric layer provides a higher dielectric constant since the dielectric constant of $TiO_2$ is substantially greater than that of $ZrO_2$. However, $TiO_2$ films have been found to have a low resistivity, which leads to high leakage currents. On the other hand, $ZrO_2$ has been shown to have good leakage current characteristics. Thus, a dielectric combining characteristics of $ZrO_2$ and $TiO_2$ should useful in a wide variety of applications. Further, the properties of a dielectric layer formed by ALD containing a mixture of $ZrO_2$ and $TiO_2$ can be controlled in a similar manner by controlling the Zr/Ti ratio.

In various embodiments, a dielectric layer having an oxide containing Ti and Zr includes thin layers of $TiO_2$ and $ZrO_2$ forming a nanolaminate. The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material. A nanolaminate of $TiO_2$ and $ZrO_2$ includes at least one thin layer of $TiO_2$, and one thin layer of $ZrO_2$, which can be written as a nanolaminate of $TiO_2/ZrO_2$. Further, a $TiO_2/ZrO_2$ nanolaminate is not limited to alternating one $TiO_2$ layer after a $ZrO_2$ layer, but can include multiple thin layers of $TiO_2$ alternating with multiple thin layers of $ZrO_2$. Further, the number of thin layers of $TiO_2$ and the number of thin layers of $ZrO_2$ can vary independently within a nanolaminate structure. A dielectric layer containing alternating layers of $TiO_2$ and $ZrO_2$ has an effective dielectric constant related to the series combination of the layers of $TiO_2$ and $ZrO_2$, which depends on the relative thicknesses of the $TiO_2$ layers and the $ZrO_2$ layers. Thus, engineering an ALD dielectric layer having nanolaminates of $TiO_2/ZrO_2$ can provide a selected dielectric constant effectively based on its Zr/Ti ratio.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. The equivalent oxide thickness, $t_{eq}$, is defined as the thickness of a theoretical $SiO_2$ layer that would have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region may result in $t_{eq}$ being from 3 to 6 Angstroms (Å) larger than the $SiO_2$ thickness, t. Thus, with the semiconductor industry driving to scale the gate dielectric equivalent oxide thickness to under 10 Å, the physical thickness for a $SiO_2$ layer used for a gate dielectric would be need to be approximately 4 to 7 Å.

Additional characteristics for a $SiO_2$ layer depend on the gate electrode used in conjunction with the $SiO_2$ gate dielectric. Using a conventional polysilicon gate results in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large bandgap of $SiO_2$ (8.9 eV) making it a good insulator from electrical conduction. Signification reductions in its bandgap would eliminate it as a material for a gate dielectric. As the thickness of a $SiO_2$ layer decreases, the number of atomic layers, or monolayers of the $SiO_2$ decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full bandgap. The lack of a full bandgap in a $SiO_2$ gate dielectric could cause an effective short between an underlying Si channel and an overlying polysilicon gate. This undesirable property sets a limit on the physical thickness to which a SiO$_2$ layer may be scaled. The minimum thickness due to this monolayer effect is thought to be about 7-8 Å. Therefore, for future devices to have a t$_{eq}$ less than about 10 Å, dielectrics other than SiO$_2$ need to be considered for use as a gate dielectric.

For a typical dielectric layer used as a gate dielectric, the capacitance is determined as one for a parallel plate capacitance: C=κ∈$_0$A/t, where κ is the dielectric constant, ∈$_0$ is the permittivity of free space, A is the area of the capacitor, and t is the thickness of the dielectric. The thickness, t, of a material is related to its t$_{eq}$ for a given capacitance, with SiO$_2$ having a dielectric constant κ$_{ox}$=3.9, as $$t=(\kappa/\kappa_{ox})t_{eq}=(\kappa/3.9)t_{eq}.$$

Thus, materials with a dielectric constant greater than that of SiO$_2$, 3.9, will have a physical thickness that may be considerably larger than a desired t$_{eq}$, while providing the desired equivalent oxide thickness. For example, an alternate dielectric material with a dielectric constant of 10 could have a thickness of about 25.6 Å to provide a t$_{eq}$ of 10 Å, not including any depletion/inversion layer effects. Thus, a reduced t$_{eq}$ for transistors may be realized by using dielectric materials with higher dielectric constants than SiO$_2$. The thinner t$_{eq}$ for lower transistor operating voltages and smaller transistor dimensions may be realized by a significant number of materials, but additional fabricating characteristics makes determining a suitable replacement for SiO$_2$ difficult.

The current view for the microelectronics industry is still for Si based devices. Thus, the gate dielectric employed will grow on a silicon substrate or silicon layer, which places significant restraints on the substitute dielectric material. During the formation of the dielectric on the silicon layer, there exists the possibility that a small layer of SiO$_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the t$_{eq}$ of the dielectric layer would be the sum of the SiO$_2$ thickness and a multiplicative factor of the thickness of the dielectric being formed, written as $$t_{eq}=t_{SiO_2}+(\kappa_{ox}/\kappa)t.$$

Thus, if a SiO$_2$ layer is formed in the process, the t$_{eq}$ is again limited by a SiO$_2$ layer. Thus, use of an ultra-thin silicon oxide interface layer should be limited to significantly less than ten angstroms. In the event that a barrier layer is formed between the silicon layer and the desired dielectric in which the barrier layer prevents the formation of a SiO$_2$ layer, the t$_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer must provide a high quality interface to maintain a high channel carrier mobility.

One of the advantages for using SiO$_2$ as a gate dielectric has been that the formation of the SiO$_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric may cause variations in the layer's dielectric constant. Many materials having a high dielectric constant relative to SiO$_2$ also have a disadvantage of a crystalline form, at least in a bulk configuration. Thus, the best candidates for replacing SiO$_2$ as a gate dielectric are those with high dielectric constant, a relatively large bandgap, and are able to be fabricated as a thin layer with an amorphous form.

Materials such as Ta$_2$O$_3$, TiO$_2$, Al$_2$O$_3$, ZrO$_2$, ZrSi$_x$O$_y$, HfSi$_x$O$_y$, and barium strontium titanate (BST) have been proposed as replacements for SiO$_2$ as gate dielectric materials. For instance, the proposed materials ZrO$_2$ and TiO$_2$ have dielectric constants of 25 and 80, respectively, and bandgaps of 7.8 eV and 3.5 eV, respectively. See G. D. Wilk et al., *Journal of Applied Physics* vol. 89: no. 10, pp. 5243-5275 (2001). In an embodiment of the present invention, a dielectric film having an atomic layer deposited oxide containing Zr and Ti allows for the engineering of a dielectric layer with a high dielectric constant selected to be in the range from about 25 to about 80 when an interfacial layer is absent from the region between a substrate and the dielectric layer. Other considerations for selecting the material and method for forming a dielectric layer for use in electronic devices and systems concern leakage current, the suitability of the material for applications requiring that the dielectric layer have an ultra-thin equivalent oxide thickness, form conformally on a substrate, and/or be engineered to specific thickness and elemental concentrations.

Another consideration concerns the roughness of the dielectric layer on a substrate. Surface roughness of the dielectric layer has a significant effect on the electrical properties of the gate oxide, and the resulting operating characteristics of the transistor. Leakage current through a physical 1.0 nm gate oxide has been found to be increased by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High-energy impacts remove body region particles creating pits. The surface of such a deposited layer may have a rough contour due to the rough interface at the body region.

In an embodiment, an oxide layer containing Zr and Ti having a substantially smooth surface relative to other processing techniques is formed using atomic layer deposition (ALD). Further, forming a dielectric layer using atomic layer deposition provides for controlling transitions between material layers. Thus, dielectric layers having an oxide layer containing Zr and Ti formed by atomic layer deposition may have an engineered transition with a substrate surface that has an interfacial layer substantially limited in thickness to provide an effective dielectric constant that is significantly greater than that of a silicon oxide layer. Further, the ALD deposited oxide layer containing Zr and Ti provide conformal coverage on the surfaces on which they are deposited.

ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired layer takes place. Subsequent to the layer growth reaction, reaction by-products and precursor excess are purged from the reaction chamber. With favourable precursor chemistry where the precursors adsorb and react with each other on the substrate aggressively, one ALD cycle may be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Thus, ALD provides for controlling layer thickness in a straightforward manner by controlling the number of growth cycles.

ALD was originally developed to manufacture luminescent and dielectric layers needed in electroluminescent displays. Significant efforts have been made to apply ALD to the growth of doped zinc sulfide and alkaline earth metal sulfide layers. Additionally, ALD has been studied for the growth of different epitaxial II-V and II-VI layers, nonepitaxial crystalline or amorphous oxide and nitride layers and multilayer structures of these. There also has been considerable interest towards the ALD growth of silicon and germanium layers, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors may be used though evaporation rates may somewhat vary during the process because of changes in their surface area.

There are several other characteristics for precursors used in ALD. The precursors must be thermally stable at the substrate temperature because their decomposition would destroy the surface control and accordingly the advantages of the ALD method that relies on the reaction of the precursor at the substrate surface. A slight decomposition, if slow compared to the ALD growth, may be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid layer. Additionally, precursors should not react with the layer to cause etching, and precursors should not dissolve in the layer. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, layers can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

The characteristics of RS-ALD include continuity at an interface, conformality over a substrate, use of low temperature and mildly oxidizing processes, freedom from first wafer effects and chamber dependence, growth thickness dependent solely on the number of cycles performed, and ability to engineer multilayer laminate layers with resolution of one to two monolayers. RS-ALD allows for deposition control on the order on monolayers and the ability to deposit monolayers of amorphous layers.

Herein, a sequence refers to the ALD material formation based on an ALD reaction of a precursor or a precursor with its reactant precursor. For example, forming a metal layer from a precursor containing the metal forms an embodiment of a metal sequence. Additionally, forming a layer of metal oxide from a precursor containing the metal and from an oxygen containing precursor as its reactant precursor forms an embodiment of a metal/oxygen sequence, which may be referred to as the metal oxide sequence. A cycle of a metal sequence includes pulsing a precursor containing the metal and pulsing a purging gas for the precursor. Further, a cycle of a metal oxide sequence includes pulsing a precursor containing the metal, pulsing a purging gas for the precursor, pulsing a reactant precursor, and pulsing a purging gas for the reactant precursor. Additionally, a cycle for a compound metal oxide includes pulsing a precursor containing a first metal, pulsing a purging gas for this precursor, pulsing a reactant precursor for the first metal precursor, pulsing a purging gas for the reactant precursor, pulsing a precursor containing a second metal, pulsing a purging gas for this precursor, pulsing a reactant precursor for the second metal precursor, and pulsing a purging gas for this reactant precursor. The order of the metal precursors can depend on the compatibility of the metals with diffusion of atoms through the metal to the underlying substrate. The order employed can limit the amount of unwanted atomic diffusion to the substrate surface.

In an embodiment, an oxide layer containing Zr and Ti is formed on a substrate mounted in a reaction chamber by ALD using precursor gases individually pulsed into the reaction chamber. Alternately, solid or liquid precursors may be used in an appropriately designed reaction chamber.

Figure 2A:
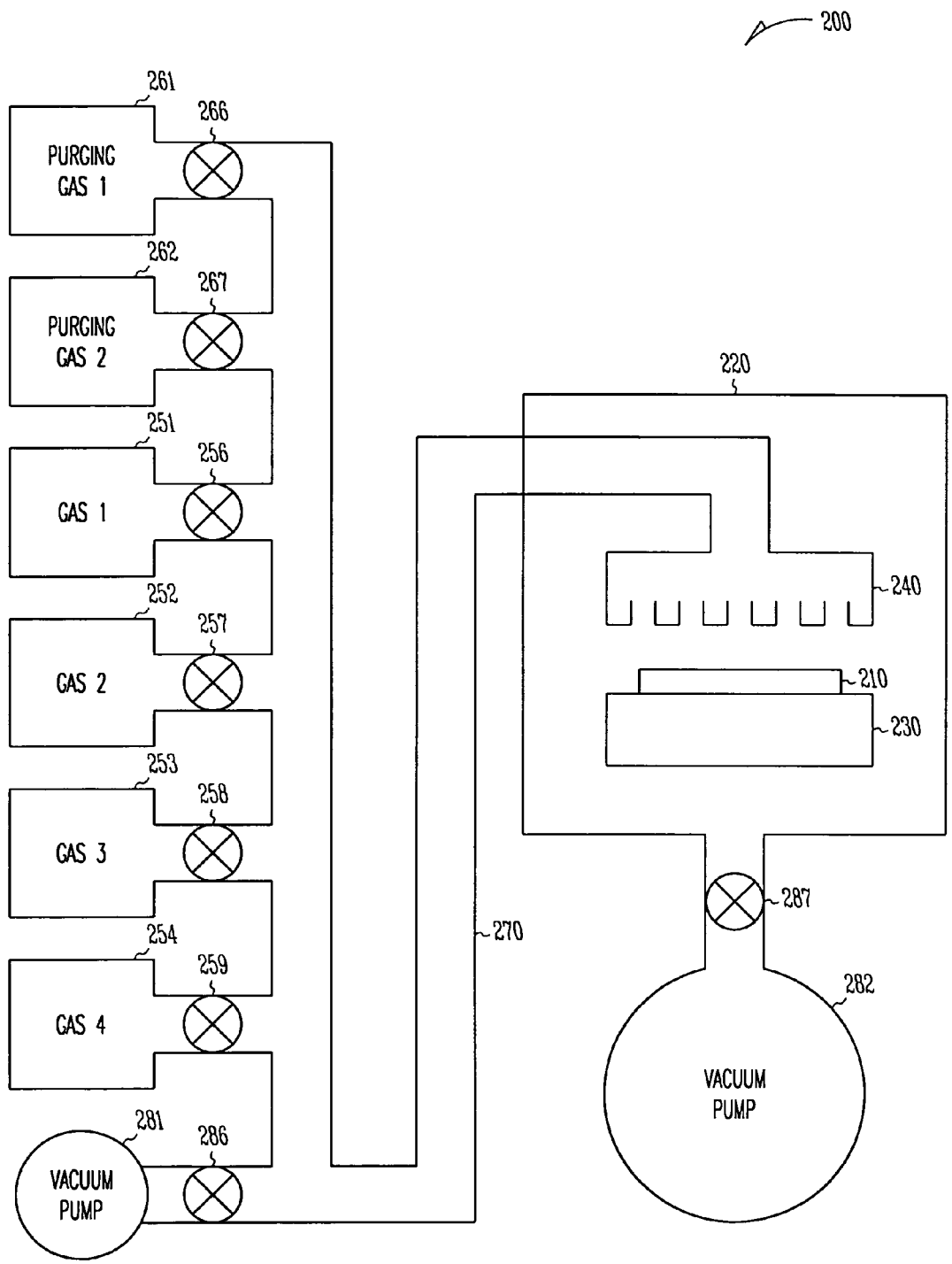
FIG. 2A shows an atomic layer deposition system for processing a dielectric layer containing an oxide of zirconium and titanium, according to various embodiments of the present invention.

FIG. 2A shows an embodiment of an atomic layer deposition system 200 for processing a dielectric layer having an oxide layer containing Zr and Ti . The elements depicted are those elements necessary for discussion of embodiments of the present invention such that those skilled in the art may practice various embodiments of the present invention without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, filed 1 Mar. 2001, now issued as U.S. Pat. No. 6,852,167, incorporated herein by reference.

In FIG. 2A, a substrate 210 is located inside a reaction chamber 220 of ALD system 200. Also located within reaction chamber 220 is a heating element 230, which is thermally coupled to substrate 210 to control the substrate temperature.

A gas-distribution fixture 240 introduces precursor gases to the substrate 210. Each precursor gas originates from individual gas sources 251-254 whose flow is controlled by mass-flow controllers 256-259, respectively. Each gas source, 251-254, provides a precursor gas either by storing the precursor as a gas or by providing a location and apparatus for evaporating a solid or liquid material to form the selected precursor gas. Furthermore, additional gas sources may be included, one for each metal precursor employed and one for each reactant precursor associated with each metal precursor.

Also included in the ALD system are purging gas sources 261, 262, each of which is coupled to mass-flow controllers 266, 267, respectively. Furthermore, additional purging gas sources may be constructed in ALD system 200, one purging gas source for each precursor gas. For a process that uses the same purging gas for multiple precursor gases less purging gas sources are used in ALD system 200.

Gas sources 251-254 and purging gas sources 261-262 are coupled by their associated mass-flow controllers to a common gas line or conduit 270, which is coupled to the gas-distribution fixture 240 inside reaction chamber 220. Gas conduit 270 is also coupled to vacuum pump, or exhaust pump, 281 by mass-flow controller 286 to remove excess precursor gases, purging gases, and by-product gases at the end of a purging sequence from gas conduit 270.

Vacuum pump, or exhaust pump, 282 is coupled by mass-flow controller 287 to remove excess precursor gases, purging gases, and by-product gases at the end of a purging sequence from reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
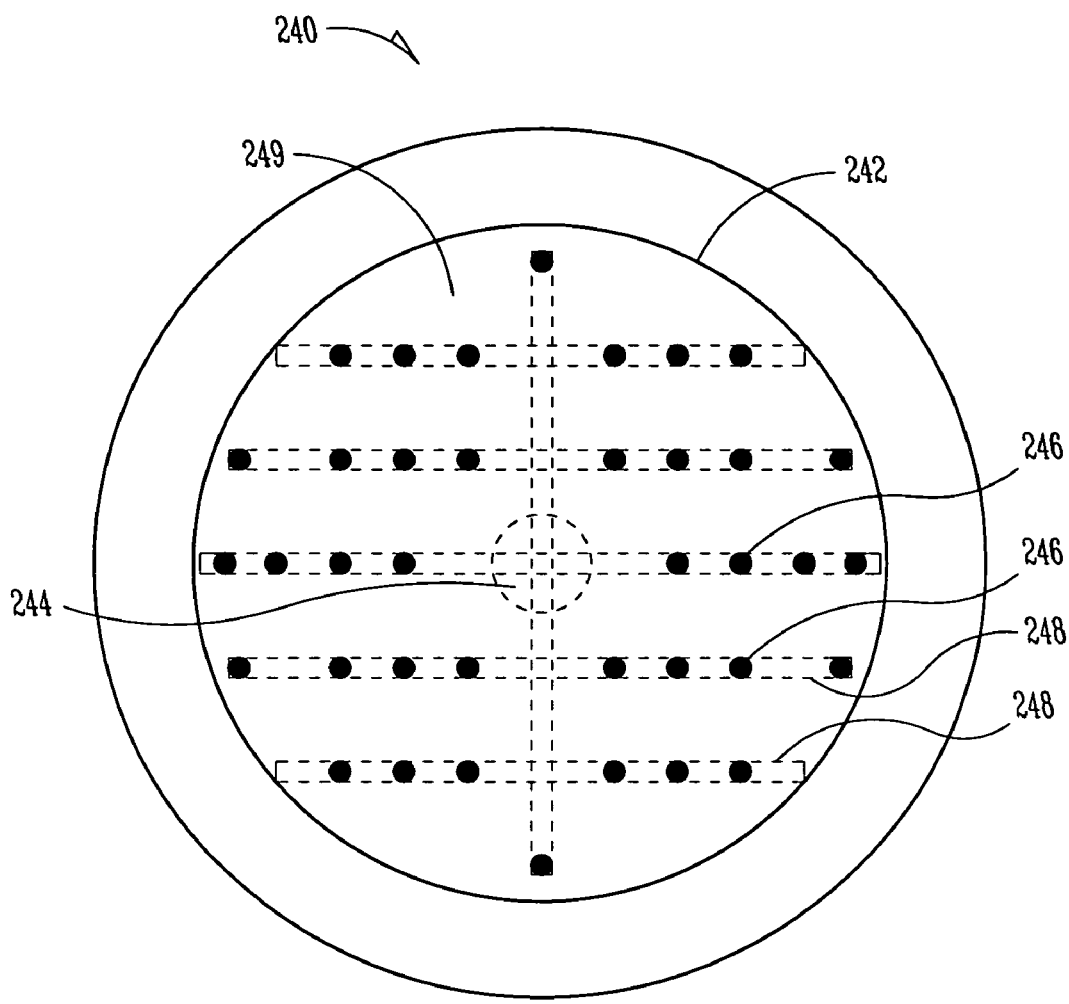
FIG. 2B shows a gas-distribution fixture of an atomic layer deposition system for processing an oxide of zirconium and titanium according to various embodiments of the present invention.

FIG. 2B shows an embodiment of a gas-distribution fixture 240 of atomic layer deposition system 200 for processing a dielectric layer having an oxide containing Zr and Ti. Gas-distribution fixture 240 includes a gas-distribution member 242, and a gas inlet 244. Gas inlet 244 couples gas-distribution member 242 to gas conduit 270 of FIG. 2A. Gas-distribution member 242 includes gas-distribution holes, or orifices, 246 and gas-distribution channels 248. In the illustrated embodiment, holes 246 are substantially circular with a common diameter in the range of 15-20 microns, gas-distribution channels 248 have a common width in the range of 20-45 microns. The surface 249 of gas distribution member 242 having gas-distribution holes 246 is substantially planar and parallel to substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though ALD system 200 is well suited for practicing embodiments of the present invention, other ALD systems commercially available may be used.

Those of ordinary skill in the art of semiconductor fabrication understand the use, construction and fundamental operation of reaction chambers for deposition of material layers. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading and studying this disclosure.

The elements of ALD system 200 may be controlled by a computer. To focus on the use of ALD system 200 in the various embodiments of the present invention, the computer is not shown. Those skilled in the art can appreciate that the individual elements such as pressure control, temperature control, and gas flow within ALD system 200 may be under computer control. In an embodiment, a computer executes instructions stored in a computer readable medium to accurately control the integrated functioning of the elements of ALD system 200 to form a dielectric layer having an oxide containing Zr and Ti.

Figure 3:
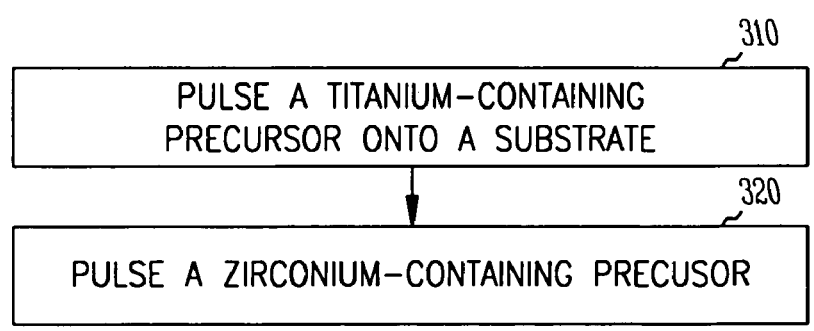
FIG. 3 illustrates a flow diagram of elements for an embodiment of a method to process an oxide of zirconium and titanium by atomic layer deposition, according to the present invention.

FIG. 3 illustrates a flow diagram of elements for an embodiment of a method to process a dielectric layer having an oxide containing Zr and Ti by atomic layer deposition. This embodiment includes pulsing a precursor containing titanium onto a substrate, at block 310, and pulsing a precursor containing zirconium, at block 320. The pulsing of the titanium-containing precursor and the zirconium-controlling precursor provides for the formation of a dielectric layer having a predetermined ratio of Zr to Ti. In an embodiment, the zirconium-containing precursor includes zirconium tertiary-butoxide, $Zr(t-OC_4H_9)_4$, also referred to as ZTB. ZTB is a precursor with a high vapor pressure allowing evaporation at low temperatures, which can be used to deposit Zr and O at low ALD temperatures. In an embodiment, a dielectric layer having an oxide containing Zr and Ti formed by atomic layer deposition has a Zr/Ti ratio of about 0.4/0.6.

Performing each atomic layer deposition includes pulsing one or more precursors into a reaction chamber for a predetermined period. The predetermined period is individually controlled for each precursor pulsed into the reaction chamber. Further the substrate is maintained at a selected temperature for each pulsing of a precursor, where the selected temperature is set independently for pulsing each precursor. Additionally, each precursor may be pulsed into the reaction under separate environmental conditions. Appropriate temperatures and pressures are maintained dependent on the nature of the precursor, whether the precursor is a single precursor or a mixture of precursors.

Using atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form an oxide film containing Zr and Ti; Additionally, the reaction chamber may also be purged by evacuating the reaction chamber.

Figure 4:
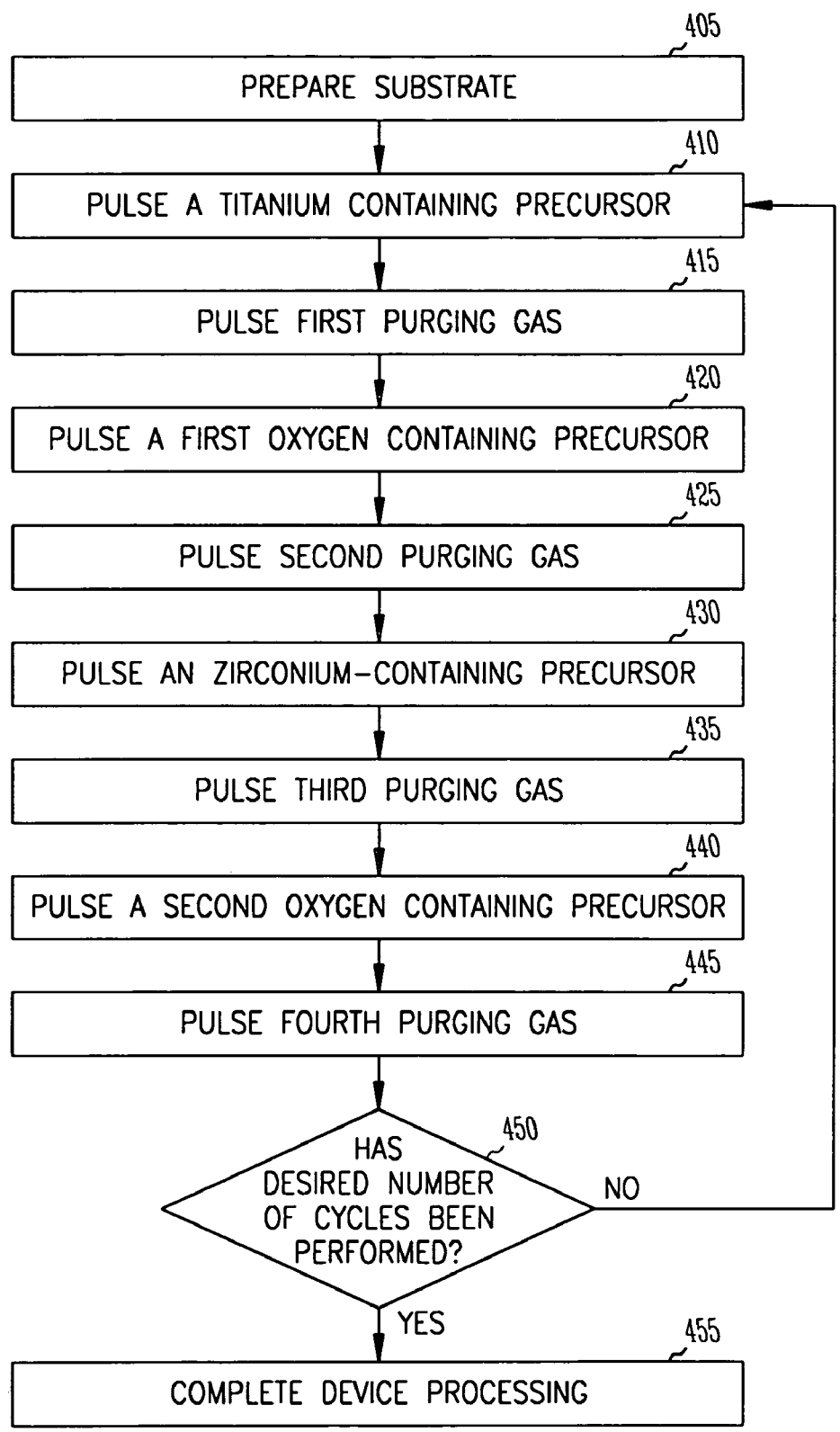
FIG. 4 illustrates a flow diagram of elements for an embodiment of a method to process an oxide of zirconium and titanium by atomic layer deposition, according to the present invention.

FIG. 4 illustrates a flow diagram of elements for an embodiment of a method to process a dielectric layer having an oxide containing Zr and Ti by atomic layer deposition. This embodiment may be implemented with the atomic layer deposition system 200 of FIG. 2A, B.

At block 405, substrate 210 is prepared. The substrate used for forming a transistor is typically a silicon or silicon containing material. In other embodiments, germanium, gallium arsenide, silicon-on-sapphire substrates, or other suitable substrates may be used. This preparation process may include cleaning of substrate 210 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric acid, HF, rinse prior to ALD processing to provide the silicon substrate with a hydrogen-terminated surface without a native silicon oxide layer.

In an embodiment, substrate 210 is prepared as a chemical oxide-terminated silicon surface prior to forming the oxide containing Zr and Ti by atomic layer deposition. This preparation allows for forming an interface layer of about five angstroms to provide a structure that aids in reducing the leakage current through the dielectric layer.

The sequencing of the formation of the regions of the transistor being processed follows typical sequencing that is generally performed in the fabrication of a MOS transistor as is well known to those skilled in the art. Included in the processing is the masking of substrate regions to be protected during the gate dielectric formation, as is typically performed in MOS fabrication. In this embodiment, the unmasked region may include a body region of a transistor; however one skilled in the art will recognize that other semiconductor device structures may utilize this process. Additionally, substrate 210 in its ready for processing form is conveyed into a position in reaction chamber 220 for ALD processing.

At block 410, a titanium-containing precursor is pulsed into reaction chamber 220. In an embodiment, $TiCl_4$ is used as a precursor. In other embodiments, a titanium-containing precursor includes but is not limited to $TiCl_4$, $TiI_4$, $Ti(OCH(CH_3)_2)_4$, or $Ti(OC_2H_5)_4$. The $TiCl_4$ precursor is pulsed into reaction chamber 220 through the gas-distribution fixture 240 on substrate 210. Mass-flow controller 256 regulates the flow of the $TiCl_4$ from gas source 251. In an embodiment, the substrate temperature is maintained between about 100° C. and about 500° C. The $TiCl_4$ reacts with the surface of the substrate 210 in the desired region defined by the unmasked areas of the substrate 210.

At block 415, a first purging gas is pulsed into reaction chamber 220. In an embodiment, nitrogen with a purity of about 99.999% is used as a purging gas. Mass-flow controller 266 regulates the nitrogen flow from the purging gas source 261 into the gas conduit 270. Using the pure nitrogen purge avoids overlap of the precursor pulses and possible gas phase reactions.

A first oxygen-containing precursor is pulsed onto substrate 210, at block 420. In an embodiment, water vapor ($H_2O$) is used as a precursor. In other embodiments, an oxygen-containing precursor for a titanium/oxygen sequence includes but is not limited to $H_2O_2$, an $H_2O$—$H_2O_2$ mixture, alcohol (ROH), $N_2O$, $O_3$, or $O_2$. The water vapor precursor is pulsed into reaction chamber 220 through the gas-distribution fixture 240 on substrate 210. Mass-flow controller 257 regulates the flow of the water vapor from gas source 252. In an embodiment, the substrate temperature is maintained between about 100° C. and about 500° C. The water vapor reacts with at the surface of substrate 210 in the desired region defined by the unmasked areas of the substrate 210.

After pulsing the first oxygen-containing precursor, a second purging gas is pulsed, at block, 425. In an embodiment, nitrogen is used as the second purging gas. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286.

In an embodiment using a $TiCl_4$/$H_2O$ vapor sequence, the substrate is held between about 100° C. and about 500° C. by the heating element 230. The $TiCl_4$ precursor can be pulsed for about 2.0 s. After the $TiCl_4$ pulse, the titanium/water vapor sequence continues with a purge pulse followed by a $H_2O$ pulse followed by a purge pulse. In an embodiment, the $H_2O$ vapor pulse time is about 2.0 sec, and the two nitrogen purging pulse times are each at about 2.0 sec.

After pulsing the second purging gas, a zirconium-containing precursor is pulsed into reaction chamber 220, at block 430. In an embodiment, the zirconium-containing precursor is ZTB. In other embodiments, a titanium-containing precursor includes but is not limited to $ZrCl_4$ and $ZrI_4$. The ZTB precursor is pulsed into reaction chamber 220 through the gas-distribution fixture 240 on substrate 210. Mass-flow controller 258 regulates the flow of the ZTB from gas source 253. In an embodiment, the substrate temperature is maintained at about 200° C. The ZTB aggressively reacts at the current surface of substrate 210.

At block 435, a third purging gas is introduced into the system. Nitrogen gas may also be used as a purging and carrier gas. The nitrogen flow is controlled by mass-flow controller 267 from the purging gas source 262 into the gas conduit 270 and subsequently into reaction chamber 220.

A second oxygen-containing precursor is pulsed on substrate 210, at block 440. In an embodiment, water vapor ($H_2O$) is used as a precursor. In other embodiments, an oxygen-containing precursor for a titanium/oxygen sequence includes but is not limited to $H_2O_2$, an $H_2O$—$H_2O_2$ mixture, alcohol (ROH), $N_2O$, $O_3$, or $O_2$. The water vapor precursor is pulsed into reaction chamber 220 through the gas-distribution fixture 240 on substrate 210. Mass-flow controller 259 regulates the flow of the water vapor from gas source 254. The water vapor reacts aggressively at the current surface of substrate 210.

After pulsing the second oxygen-containing precursor, a fourth purging gas is pulsed, at block, 445. In an embodiment, nitrogen is used as the fourth purging gas. Excess precursor gas, and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286. With the conclusion of the fourth purging gas pulse, a cycle forming an atomic layer deposited dielectric having an oxide containing Zr and Ti is completed.

During the ZTB/water vapor sequence, the substrate is held between about 200° C. and about 400° C. by the heating element 230. The process pressure is maintained at about 0.4 kPa for the ZTB and about 0.13 to about 1.05 kPa. Pulse times for the ZTB range from less than 25 s to greater than 160 s. The water vapor pulse time is about 60 s. In an embodiment, the pulse time for each of the ZTB pulse and the water vapor pulse is about 60 s.

At block 450, a determination is made as to whether a desired number of cycles has been performed, that is, whether the number of completed cycles is equal to a predetermined number. The predetermined number corresponds to a predetermined thickness for the ALD dielectric film having an oxide containing Zr and Ti. If the number of completed cycles is less than the predetermined number, the titanium-containing precursor is pulsed into reaction chamber 220, at block 410, and the process continues. If the total number of cycles to form the desired thickness has been completed, the dielectric layer having an oxide containing Zr and Ti may be annealed. To avoid the diffusion of oxygen during annealing to the semiconductor substrate surface, annealing may be performed in an oxygen-free environment for short periods of time. An embodiment of an annealing environment may include a nitrogen atmosphere. In addition to limiting or avoiding oxygen diffusion to the semiconductor substrate, the relatively low temperatures employed by atomic layer deposition using ZTB allows for the formation of an amorphous dielectric layer.

The thickness of a dielectric layer having an oxide containing Zr and Ti is determined by a fixed growth rate for the pulsing periods and precursors used, set at a value such as N nm/cycle. For a desired dielectric layer thickness, t, in an application such as forming a gate dielectric of a MOS transistor, the ALD process is repeated for t/N total cycles. Once the t/N cycles have completed, no further ALD processing for dielectric layer is performed. In an embodiment, ALD processing provides for the engineering of a dielectric layer containing $ZrTiO_4$ having a dielectric constant in the range from about 25 to about 80, depending on the Zr/Ti ratio.

At block 455, after forming the dielectric film having an oxide containing Zr and Ti, processing the device having this dielectric layer is completed. In an embodiment, completing the device includes completing the formation of a transistor. In an embodiment, completing the device includes completing the formation of a capacitor. In an embodiment, completing the process includes completing the construction of a memory device having an array with access transistors formed with gate dielectrics containing atomic layer deposited oxide containing Zr and Ti. In an embodiment, completing the process includes the formation of an electronic system including an information handling device that uses electronic devices with transistors formed with dielectric layers having an atomic layer deposited oxide containing Zr and Ti.

Upon reading and comprehending this disclosure, it can be appreciated by those skilled in the art that the elements of a method for forming an atomic layer deposited oxide containing Zr and Ti in the embodiment of FIG. 4 may be performed under various other environmental conditions, including various pressures and temperatures, and pulse periods depending on the dielectric layer to be formed for a given application and the system used to fabricate the oxide containing Zr and Ti. Determination of the environmental conditions, precursors used, purging gases employed, and pulse periods for the precursors and purging gases may be made without undue experimentation.

Atomic layer deposition of a dielectric layer having an oxide containing Zr and Ti may be processed in an atomic layer deposition system such as ALD system 200 under computer control to perform various embodiments, and operated under computer-executable instructions to perform these embodiments. In an embodiment, a computerized method and the computer-executable instructions includes pulsing a titanium-containing precursor onto a substrate and pulsing a zirconium-containing precursor. Controlling the pulsing of the titanium-containing precursor and the pulsing of the zirconium-containing precursor provides for engineering a dielectric layer having an oxide with a predetermined ratio of Zr to Ti. In an embodiment, a zirconium-containing precursor includes ZTB for forming the dielectric at temperatures less than 400° C. In an embodiment, a zirconium-containing precursor includes ZTB for forming the dielectric at temperatures at about 200° C. In an embodiment, a zirconium-containing precursor includes ZTB for forming the dielectric at temperatures ranging from about 200° C. to about 400° C.

In an embodiment, a computerized method and the computer-executable instructions for a method for forming a dielectric layer having an oxide containing Zr and Ti includes forming the dielectric layer by atomic layer deposition, where each precursor is pulsed into a reaction chamber for a predetermined period. The predetermined period is individually controlled for each precursor pulsed into the reaction chamber. Further, the substrate may be maintained at a selected temperature for each pulsing of a precursor, where the selected temperature is set independently for pulsing each precursor. In addition, each pulsing of a precursor is followed by purging the reaction chamber with a purging gas.

In an embodiment, a computerized method and the computer-executable instructions for a method for forming a dielectric layer include regulating the deposition of titanium, zirconium, and oxygen to form a dielectric layer having an oxide with a predetermined Zr/Ti ratio to engineer a corresponding dielectric constant in the range from about 25 to about 80.

In an embodiment, a computerized method and the computer-executable instructions for a method for forming a dielectric layer having an oxide containing Zr and Ti include controlling an environment of a reaction chamber. Additionally, the computerized method controls the pulsing of purging gases, one for each precursor gas and pulsing each purging gas after pulsing the associated precursor gas. Using a computer to control parameters for growing an oxide containing Zr and Ti provides for processing a dielectric layer over a wide range of parameters allowing for the determination of an optimum parameter set for the ALD system used. The computer-executable instructions may be provided in any computer-readable medium. Such computer-readable medium may include, but is not limited to, floppy disks, diskettes, hard disks, CD-ROMS, flash ROMS, nonvolatile ROM, and RAM.

An embodiment of this method may be realized using ALD system 200 of FIG. 2A, where the controls for the individual elements of ALD system 200 are coupled to a computer, not shown in FIG. 2A. The computer provides control of the operation for processing a dielectric layer having an oxide containing Zr and Ti by regulating the flow of precursor gases into reaction chamber 220. The computer controls the flow rate of precursor gases and the pulsing periods for these gases by controlling mass-flow controllers 256-259. Additionally, the computer controls the temperature of gas sources 251-254. Further, the pulse period and flow of purging gases from purging gas sources 261, 262 is regulated through computer control of mass-flow controllers 266, 267, respectively.

The computer also regulates the environment of reactor chamber 220 in which a dielectric layer is being formed on substrate 210. The computer regulates the pressure in reaction chamber 220 within a predetermined pressure range by controlling vacuum pumps 281, 282 through mass-flow controllers 286, 287, respectively. The computer also regulates the temperature range for substrate 210 within a predetermined range by controlling heater 230.

For convenience, the individual control lines to elements of ALD 200, as well as a computer, are not shown in FIG. 2A. The above description of the computer control in conjunction with FIG. 2A provides information for those skilled in the art to practice embodiments for forming a dielectric layer having an oxide containing Zr and Ti using a computerized method as described herein.

The embodiments described herein provide a process for growing an oxide containing Zr and Ti having a wide range of useful equivalent oxide thickness, $t_{eq}$, associated with the oxide having a predetermined Zr/Ti ratio to provide a dielectric constant in the range from about 25 to about 80. The relatively large dielectric constant for an oxide containing Zr and Ti allows for the engineering of dielectric layers having a physical thickness in the 10 nm (100 Å) range, while achieving a $t_{eq}$ of less than 2.5 nm (25 Å). Without an interfacial layer between a substrate and an oxide containing Zr and Ti, a dielectric layer containing the oxide may be attained with a $t_{eq}$ ranging from about 1.5 Å to about 10 Å. Further, an atomic layer deposited oxide containing Zr and Ti layer may provide a $t_{eq}$ significantly less than 2 or 3 Å, even less than 1.5 Å.

Attainment of a $t_{eq}$ in the thickness range of one to a several monolayers is associated with an interfacial layer between a semiconductor substrate surface and the an oxide containing Zr and Ti that is exceptionally small or composed of a material having a dielectric constant approaching the value for the oxide containing Zr and Ti. To obtain the smallest possible $t_{eq}$, the formation of a SiO$_2$ interfacial layer should be avoided. However, having a silicon oxide layer or a silicate layer between the substrate and the ZrTiO$_4$ layer can aid in the reduction of leakage current. Alternately, a relatively thin barrier layer can be formed on the substrate prior to forming an oxide containing Zr and Ti. The material for the barrier layer is chosen such that the material has a dielectric constant larger than SiO$_2$, in addition to preventing formation of a SiO$_2$ interfacial layer. In an embodiment, a thin layer of silicon nitride is deposited on a substrate by atomic layer deposition prior to forming an oxide containing Zr and Ti. Atomic layer deposition of a silicon nitride barrier layer can include the use of SiCl$_4$ and NH$_3$ precursors to form a layer less than about 5 angstroms thick.

Additional barrier layers to oxygen diffusion can be formed dependent on the application for the oxide containing Zr and Ti. In various embodiments in which a dielectric layer is directly connected to a contact layer, the contact layer can include one or more conductive layers that act as a barrier layer. In an embodiment, a contact to a dielectric layer containing Zr and Ti contains TiN formed by atomic layer deposition. ALD formation of the TiN layer can include the use of TiCl$_4$ and NH$_3$ precursors along with an Ar purging gas. Though the TiN layer can be formed by conventional chemical layer deposition (CVD), TiN layers deposited by ALD were found to provide layers of lower resistivity and low surface roughness with step coverage conformality at lower temperatures than for CVD processing. See B. Kim et al., *Materials Research Society Symposium Proceedings*, vol. 672, pp. 0.7.8.1-0.7.8.6 (2001). In various embodiments for dielectric layers having an oxide containing Zr and Ti, TiN layers can be formed as part of contacts to the dielectric layer such as for capacitor electrodes and gates in MOS devices.

Figure 5:
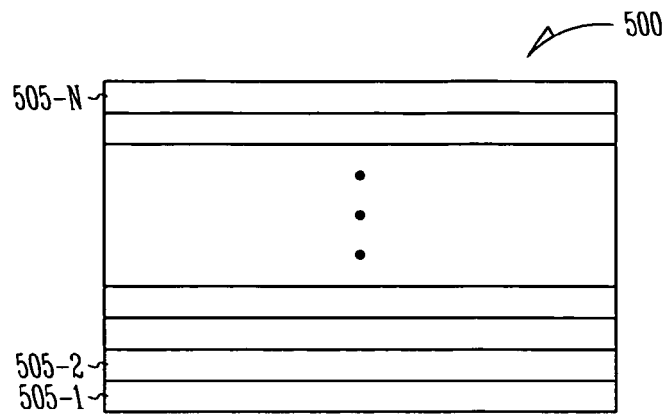
FIG. 5 depicts an embodiment of a dielectric layer including a nanolaminate of zirconium oxide and titanium oxide formed by atomic layer deposition, according to the present invention.

Dielectric layers having an oxide containing Zr and Ti using embodiments of the present invention may be engineered with various structures and compositions including an amorphous structure. Embodiments using low processing temperatures tend to provide an amorphous structure, which is better suited for reducing leakage current than structures exhibiting a polycrystalline structure or a partial polycrystalline structure. One embodiment for a dielectric structure includes a nanolaminate structure as shown in FIG. 5, which depicts an embodiment of a dielectric layer including atomic layer deposited nanolaminates of zirconium oxide and titanium oxide.

The nanolaminate structure 500 includes a plurality of nano-layers 505-1 to 505-N, where each nano-layer contains TiO$_2$ or ZrO$_2$. The sequencing of the nano-layers can depend on the application. The effective dielectric constant associated with nanolaminate structure 500 is that attributable to N capacitors in series, where each capacitor has a thickness defined by the thickness of the corresponding TiO$_2$ or ZrO$_2$ nano-layer. By selecting each thickness and the composition of each nano-layer, TiO$_2$ or ZrO$_2$, a nanolaminate structure can be engineered to have a predetermined dielectric constant. Also, by selecting each thickness and the composition of each thickness, TiO$_2$ or ZrO$_2$, a Zr/Ti ratio is predetermined for nanolaminate structure 500. Further, selecting the Zr/Ti ratio can depend on the application for the dielectric layer. For instances, a titanium-rich dielectric layer provides a higher dielectric constant since the dielectric constant of TiO$_2$ is substantially greater than that of ZrO$_2$. On the other hand, ZrO$_2$ has been shown to have good leakage current characteristics. Other embodiments include a nanolaminate structure in which each nano-layer contains Zr$_x$T$_y$O$_z$, ZrO$_2$, TiO$_2$, or a mixture of ZrO$_2$ and TiO$_2$.

Any micro-roughness associated with thin oxide layers formed according to an embodiment of the present invention may be due to partial monolayer formation of the dielectric layer across the substrate surface. With some areas of the dielectric layer forming a monolayer in two or three cycles, while another area or region of the layer forms a monolayer in one or two cycles, the surface of the ALD dielectric layer may exhibit some micro-roughness. As can be understood by those skilled in the art, particular growth rates and processing conditions for providing a dielectric layer having an oxide containing Zr and Ti with reduced or substantially eliminated micro-roughness may be determined during normal initial testing of the ALD system used for a given application without undue experimentation.

Embodiments of processes described above for performing atomic layer deposition of an oxide containing Zr and Ti are used to precisely control the thickness of the dielectric layer formed, where, in addition to providing a t$_{eq}$ less than about 10 to 20 angstroms, the atomic layer deposition process provides for relatively smooth surfaces and limited interfacial layer formation. Additionally, these embodiments for ALD processing of an oxide containing Zr and Ti may be implemented to form transistors, capacitors, memory devices, and other electronic systems including electro-optic devices, microwave devices, and information handling devices. With careful preparation and engineering of the dielectric having an oxide containing Zr and Ti, limiting the size of interfacial regions, a teq less than about 10 Å for these devices is anticipated.

A transistor 100 as depicted in FIG. 1 may be constructed by forming a source region 120 and a drain region 130 in a silicon based substrate 110 where source and drain regions 120, 130 are separated by a body region 132. Body region 132 defines a channel having a channel length 134. A dielectric layer is disposed on substrate 110 formed as a layer having an oxide containing Zr and Ti by atomic layer deposition. The resulting dielectric layer forms gate dielectric 140.

A gate 150 is formed over gate dielectric 140. Typically, forming gate 150 may include forming a polysilicon layer, though a metal gate may be formed in an alternative process. In an embodiment, gate 150 contains TiN as a barrier material to oxygen diffusion. In an embodiment, a barrier layer 133 is formed between body region 132 and gate dielectric 140. Barrier layer 133 can be limited to a thickness less than 1 nm (10 Å). In an embodiment, barrier layer 133 includes silicon nitride. In an embodiment, barrier layer 133 has a composition and thickness selected such that the effective dielectric constant of the combination of barrier layer 133 and gate dielectric 140 is not substantially reduced from the dielectric constant associated with gate dielectric 140. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 6:
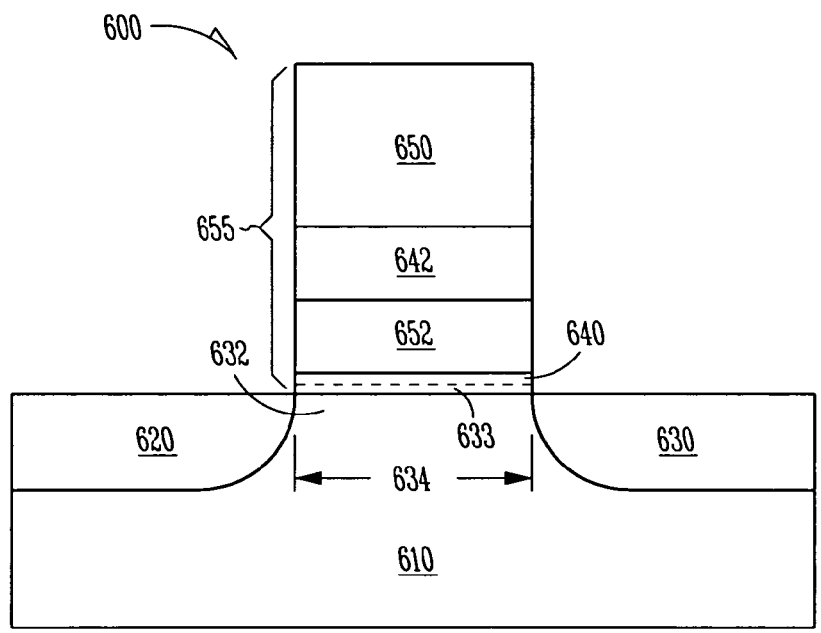
FIG. 6 shows an embodiment of a configuration of a transistor having a dielectric layer including an atomic layer deposited oxide of zirconium and titanium, according to the present invention.

The method for forming an ALD dielectric layer having an oxide containing Zr and Ti in various embodiments may be applied to other transistor structures having dielectric layers. FIG. 6 shows an embodiment of a configuration of a transistor 600 having an ALD dielectric layer having an oxide containing Zr and Ti. Transistor 600 includes a silicon based substrate 610 with a source 620 and a drain 630 separated by a body region 632. Body region 632 between source 620 and drain 630 defines a channel region having a channel length 634. Located above body region 632 is a stack 655 including a gate dielectric 640, a floating gate 652, a floating gate dielectric 642, and a control gate 650. Gate dielectric 640 includes an oxide containing Zr and Ti formed by atomic layer deposition as described herein with the remaining elements of the transistor 600 formed using processes known to those skilled in the art. Alternately, both gate dielectric 640 and floating gate dielectric 642 may be formed as dielectric layers having an oxide containing Zr and Ti in various embodiments as described herein. In an embodiment, a barrier layer 633 formed between gate dielectric 640 and body region 632 is limited to a thickness less than 1 nm (10 Å). In an embodiment, barrier layer 633 includes silicon nitride. In an embodiment, barrier layer 633 has a composition and thickness selected such that the effective dielectric constant of the combination of barrier layer 633 and gate dielectric 640 is not substantially reduced from the dielectric constant associated with gate dielectric 640.

Figure 7:
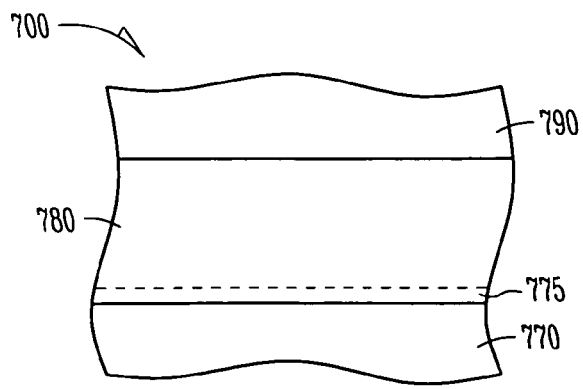
FIG. 7 shows an embodiment of a configuration of a capacitor having a dielectric layer including an atomic layer deposited oxide of zirconium and titanium, according to the present invention.

The embodiments of methods for forming dielectric layers having an oxide containing Zr and Ti may also be applied to forming capacitors in various integrated circuits, memory devices, and electronic systems. In an embodiment for forming a capacitor 700 illustrated in FIG. 7, a method includes forming a first conductive layer 770, forming a dielectric layer 780 having an oxide containing Zr and Ti on first conductive layer 770 by atomic layer deposition, and forming a second conductive layer 790 on dielectric layer 780. In an embodiment, one or both of first conductive layer 770 and second conductive layer 790 includes TiN. In an embodiment, a barrier layer 775 is formed between dielectric layer 780 and first conductive layer 770. Barrier layer 775 can be limited to a thickness less than 1 nm (10 Å). In an embodiment, barrier layer 775 includes silicon nitride. In an embodiment, barrier layer 775 has a composition and thickness selected such that the effective dielectric constant of the combination of barrier layer 775 and dielectric 780 is not substantially reduced from the dielectric constant associated with dielectric 780. ALD formation of the dielectric layer having an oxide containing Zr and Ti allows the dielectric layer to be engineered within a predetermined composition providing a desired dielectric constant.

Transistors, capacitors, and other devices dielectric layers having an oxide containing Zr and Ti formed by atomic layer deposition using methods described herein may be implemented into memory devices and electronic systems including information handling devices. Such information devices may include wireless systems, telecommunication systems, and computers. It will be recognized by one skilled in the art that several types of memory devices and electronic systems including information handling devices utilize embodiments of the present invention.

Figure 8:
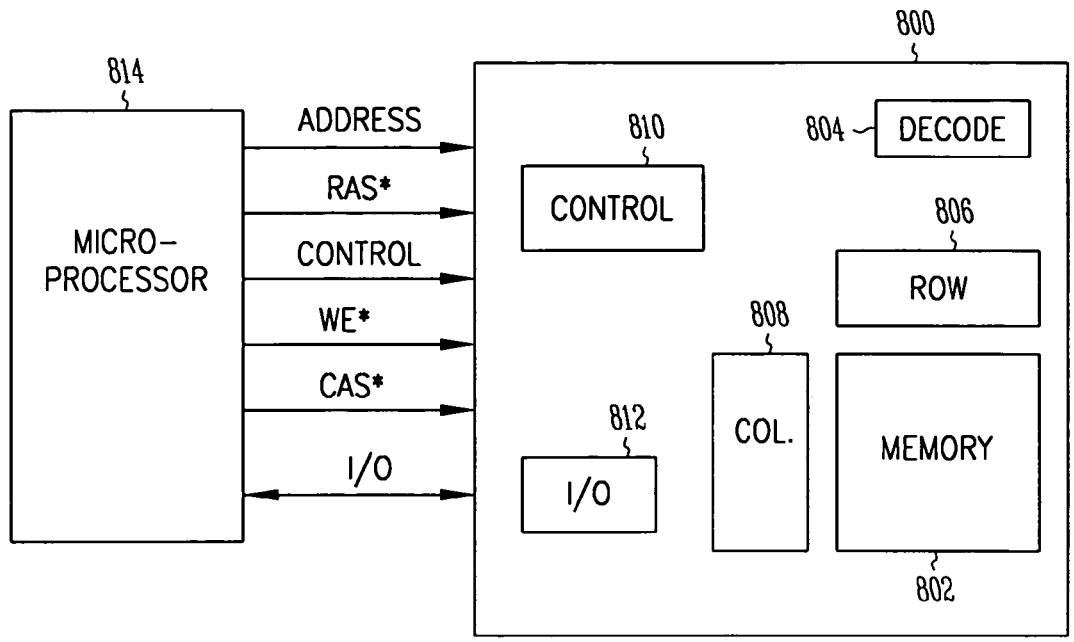
FIG. 8 is a simplified block diagram for an embodiment of a memory device with a dielectric layer including an atomic layer deposited oxide of zirconium and titanium, according to the present invention.

FIG. 8 is a simplified block diagram of a memory device 800 using an embodiment of a dielectric having an oxide containing Zr and Ti formed by atomic layer deposition. Memory device 800 includes an array of memory cells 802, address decoder 804, row access circuitry 806, column access circuitry 808, control circuitry 810, and Input/Output circuit 812. The memory is operably coupled to an external microprocessor 814, or memory controller for memory accessing. Memory device 800 receives control signals from processor 814, such as WE*, RAS* and CAS* signals, which can be supplied on a system bus. Memory device 800 stores data that is accessed via I/O lines. Each memory cell in a row of memory cell array 802 is coupled to a common word line. The word line is coupled to gates of individual transistors, where at least one transistor has a gate coupled to a gate dielectric having an oxide containing Zr and Ti formed by atomic layer deposition in accordance with the method and structure previously described herein. Additionally, each memory cell in a column is coupled to a common bit line. Each cell in memory array 802 may include a storage capacitor and an access transistor as is conventional in the art. It will be appreciated by those skilled in the art that additional circuitry and control signals can be provided, and that the memory device of FIG. 8 has been simplified to help focus on embodiments of the present invention.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Figure 9:
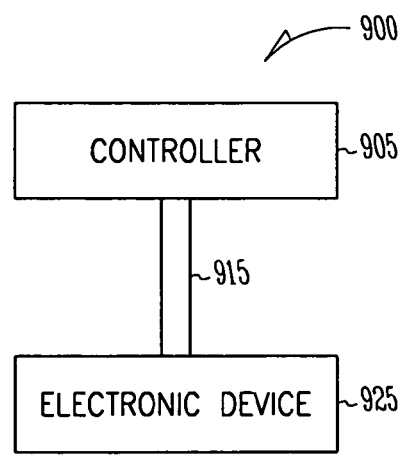
FIG. 9 illustrates a block diagram for an embodiment of an electronic system having devices with a dielectric layer including an atomic layer deposited oxide of zirconium and titanium, according to the present invention.

FIG. 9 illustrates a block diagram for an electronic system 900 having devices with an embodiment for a dielectric layer including an atomic layer deposited oxide of zirconium and titanium. Electronic system 900 includes a controller 905, a bus 915, and an electronic device 925, where bus 915 provides electrical conductivity between controller 905 and electronic device 925. In various embodiments, controller 905 and/or electronic device 925 includes an embodiment for a dielectric layer having an oxide containing Zr and Ti formed by atomic layer deposition as previously discussed herein. The oxide containing Zr and Ti includes Zr and Ti according to a predetermined Zr/Ti ratio. In an embodiment, electronic system 900 includes a plurality of electronic devices using an embodiment for a dielectric layer having an oxide containing Zr and Ti according to the present invention. Electronic system 900 may include, but is not limited to, information handling devices, wireless systems, telecommunication systems, fiber optic systems, electro-optic systems, and computers.

CONCLUSION

A dielectric layer having an oxide containing Zr and Ti, formed by atomic layer deposition using methods described herein, provides a reliable dielectric layer having an equivalent oxide thickness thinner than attainable using $SiO_2$. Forming dielectric layers having an oxide containing Zr and Ti by atomic layer deposition in relatively low processing temperatures allows for dielectric layers that are amorphous and conformally layered on a substrate surface. Further, the ALD formation of these dielectric layers provides for enhanced dielectric and electrical properties relative to those attained with an amorphous $SiO_x$ layer. These properties of dielectric layers having an oxide containing Zr and Ti formed by atomic layer deposition allow for application as dielectric layers in numerous devices and systems.

Capacitors, transistors, electro-optic devices, higher level ICs or devices, and electronic systems are constructed utilizing various embodiments for forming a dielectric layer having an oxide containing Zr and Ti structured to provide an ultra thin equivalent oxide thickness, $t_{eq}$. Dielectric layers containing an atomic layer deposited oxide containing Zr and Ti are formed having a dielectric constant substantially higher than that of silicon oxide, where such dielectric layers are capable of a $t_{eq}$ thinner than 10 Å, thinner than the expected limit for SiO$_2$ gate dielectrics. The thinner $t_{eq}$ of these dielectric layers allows for a higher capacitance than SiO$_2$ gate dielectrics, which provides further effective scaling for microelectronic devices and systems. At the same time, the physical thickness of the dielectric layer having an oxide containing Zr and Ti formed by atomic layer deposition is much larger than the SiO$_2$ thickness associated with the $t_{eq}$ limit of SiO$_2$. Forming the larger thickness aids in the manufacturing process for gate dielectrics and other dielectric layers.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claimed is:

1. A device having a dielectric layer comprising:
   a dielectric layer having:
      an oxide layer containing Zr and Ti disposed above a substrate, the oxide layer essentially consisting of oxygen, Zr, and Ti; and
      a silicon nitride layer contacting the substrate at a conductive layer of the substrate, the silicon nitride layer arranged as a barrier layer separating the oxide layer and the conductive layer, the conductive layer and the dielectric layer configured as an active portion of a charge-based device.

2. The device of claim 1, wherein the oxide layer containing Zr and Ti has a predetermined ratio of zirconium to titanium.

3. The device of claim 1, wherein the silicon nitride layer has a thickness less than 1 nm.

4. The device of claim 1, further including a contact containing TiN connected to the dielectric layer.

5. The device of claim 1, wherein the device includes a transistor in which the dielectric layer is disposed as a gate dielectric.

6. The device of claim 5 wherein the device includes a memory in which the dielectric layer contacts a gate of a transistor in the memory.

7. The device of claim 1, wherein the device includes a conductive path to a conductive layer contacting the dielectric layer, the conductive path to provide a signal to the conductive layer responsive to an external signal from another device in an electronic system.

8. A device having a dielectric layer comprising:
   a dielectric layer having:
      an oxide layer containing Zr and Ti disposed above a substrate; and
      a silicon nitride layer contacting the substrate at a conductive layer of the substrate, the silicon nitride layer arranged as a barrier layer separating the oxide layer and the conductive layer, the conductive layer and the dielectric layer configured as an active portion of a charge-based device, wherein the oxide layer containing Zr and Ti includes ZrTiO$_4$.

9. A device having a dielectric layer comprising:
   a dielectric layer having:
      an oxide layer containing Zr and Ti disposed above a substrate, the oxide layer essentially consisting of oxygen, Zr, and Ti; and
      a silicon nitride layer contacting a conductive layer, the silicon nitride layer arranged as a barrier layer separating the oxide layer and the conductive layer, the conductive layer and the dielectric layer configured as an active portion of a charge-based device, wherein the dielectric layer includes a nanolaminate of ZrO$_2$ and TiO$_2$.

10. The device of claim 1, A device having a dielectric layer comprising:
    a dielectric layer having:
       an oxide layer containing Zr and Ti disposed above a substrate, the oxide layer essentially consisting of oxygen, Zr, and Ti; and
       a silicon nitride layer contacting a conductive layer, the silicon nitride layer arranged as a barrier layer separating the oxide layer and the conductive layer, the conductive layer and the dielectric layer configured as an active portion of a charge-based device, wherein the device includes a capacitor in which the dielectric layer is disposed as a capacitor dielectric.

11. The device of claim 10, wherein the device includes a memory in which the capacitor is disposed.

12. A device having a dielectric layer comprising:
    a dielectric layer having:
       an oxide layer containing Zr and Ti disposed above a substrate, the oxide layer essentially consisting of oxygen, Zr, and Ti; and
       a silicon nitride layer contacting a conductive layer, the silicon nitride layer arranged as a barrier layer separating the oxide layer and the conductive layer, the conductive layer and the dielectric layer configured as an active portion of a charge-based device, wherein the device includes a transistor in which the dielectric layer is disposed as a floating gate dielectric.

13. A capacitor, comprising:
    a first conductive layer;
    a dielectric layer disposed on the first conductive layer, the dielectric layer containing a zirconium titanium oxide layer including ZrTiO$_4$ and a silicon nitride layer; and
    a second conductive layer disposed on the dielectric layer, wherein the silicon nitride layer contacts the first conductive layer or the second conductive layer such that the silicon nitride layer is arranged as a barrier layer separating the zirconium titanium oxide layer and the conductive layer that the silicon nitride layer contacts.

14. The capacitor of claim 13, wherein the film containing ZrTiO$_4$ includes a film containing ZrTiO$_4$ with a predetermined ratio of Zr to Ti.

15. The capacitor of claim 13, wherein the layer containing ZrTiO$_4$ includes a film containing ZrTiO$_4$ with a Zr/Ti ratio of about 0.4/0.6.

16. The capacitor of claim 13, wherein the second conductive layer includes TiN.

17. A transistor comprising:
    a body region in a substrate between a source region and a drain region;
    a dielectric layer disposed on the body region between the source region and the drain region, the dielectric layer containing a zirconium titanium oxide layer and a silicon nitride layer; and
    a gate disposed above the dielectric layer, wherein the silicon nitride layer contacts a conductive layer of an active portion of the transistor such that the silicon nitride layer is arranged as a barrier layer separating the zirconium titanium oxide layer and the conductive layer.

18. The transistor of claim 17, wherein the zirconium titanium oxide layer has a predetermined ratio of zirconium to titanium.

19. The transistor of claim 17, the silicon nitride layer has a thickness selected such that an effective dielectric constant of the dielectric layer is not substantially reduced from a dielectric constant of the dielectric layer without the silicon nitride layer.

20. The transistor of claim 17, wherein the gate includes TiN.

21. The transistor of claim 17, wherein the dielectric layer has an equivalent oxide thickness ($t_{eq}$) of less than about 10 Angstroms.

22. The transistor of claim 17, wherein the gate includes a control gate.

23. The transistor of claim 17, wherein the gate includes a floating gate.

24. A memory comprising:
a number of access transistors, at least one access transistor including a gate coupled to a dielectric layer, the dielectric layer disposed on a body region in a substrate between a source region and a drain region, the dielectric layer containing a zirconium titanium oxide layer and a silicon nitride layer, the silicon nitride layer contacting a conductive layer of an active portion of the at least one transistor such that the silicon nitride layer is arranged as a barrier layer separating the zirconium titanium oxide layer and the conductive layer; and
a number of bit lines coupled to the number of access transistors.

25. The memory of claim 24, wherein the oxide containing Zr and Ti has a predetermined ratio of Zr to Ti.

26. The memory of claim 24, wherein the gate includes TiN.

27. The memory of claim 24, wherein the dielectric layer has an equivalent oxide thickness ($t_{eq}$) of less than about 10 Angstroms.

28. An electronic system comprising:
a controller;
a bus; and
an electronic device coupled to the controller by the bus, wherein the electronic device includes a dielectric layer having:
an oxide layer containing Zr and Ti disposed above a substrate; and
a silicon nitride layer contacting a conductive layer, the silicon nitride layer arranged as a barrier layer separating the oxide layer and the conductive layer, the conductive layer and the dielectric layer configured as an active portion of a charge-based device.

29. The electronic system of claim 28, wherein the oxide layer containing Zr and Ti includes $ZrTiO_4$.

30. The electronic system of claim 29, wherein the oxide layer containing Zr and Ti includes a predetermined ratio of zirconium to titanium.

31. The electronic system of claim 29, wherein the oxide layer containing Zr and Ti includes a nanolaminate of $ZrO_2$ and $TiO_2$.

32. The electronic system of claim 29, wherein the dielectric layer forms a gate dielectric of a transistor with a gate containing TiN coupled to the dielectric layer.

33. The electronic system of claim 29, wherein the dielectric layer has an equivalent oxide thickness ($t_{eq}$) of less than about 10 Angstroms.

34. The electronic system of claim 29, wherein the controller is a processor and the electronic device is a memory device.

* * * * *

UNITED STATES PATENT AND TRADEMARK OFFICE
CERTIFICATE OF CORRECTION

| | | |
|---|---|---|
| PATENT NO. | : 7,863,667 B2 | Page 1 of 1 |
| APPLICATION NO. | : 11/212306 | |
| DATED | : January 4, 2011 | |
| INVENTOR(S) | : Kie Y. Ahn et al. | |

It is certified that error appears in the above-identified patent and that said Letters Patent is hereby corrected as shown below:

In column 19, line 49, in Claim 6, delete "claim 5" and insert -- claim 5, --, therefor.

In column 20, line 13, in Claim 10, before "A" delete "The device of claim 1,".

Signed and Sealed this
First Day of March, 2011

David J. Kappos
*Director of the United States Patent and Trademark Office*